United States Patent
Yako et al.

(10) Patent No.: US 12,320,701 B2
(45) Date of Patent: Jun. 3, 2025

(54) FILTER ARRAY AND IMAGING SYSTEM

(71) Applicant: Panasonic Intellectual Property Management Co., Ltd., Osaka (JP)

(72) Inventors: Motoki Yako, Osaka (JP); Atsushi Ishikawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 178 days.

(21) Appl. No.: 18/162,730

(22) Filed: Feb. 1, 2023

(65) Prior Publication Data
US 2023/0168126 A1 Jun. 1, 2023

Related U.S. Application Data

(63) Continuation of application No. PCT/JP2021/028235, filed on Jul. 30, 2021.

(30) Foreign Application Priority Data

Aug. 24, 2020 (JP) .................................. 2020-140906

(51) Int. Cl.
*G01J 3/28* (2006.01)
*G01J 3/26* (2006.01)
(Continued)

(52) U.S. Cl.
CPC .............. *G01J 3/2823* (2013.01); *G01J 3/26* (2013.01); *G01J 3/36* (2013.01); *G01J 3/513* (2013.01);
(Continued)

(58) Field of Classification Search
CPC .... G01J 3/2823; G01J 2003/2826; G01J 3/26; G01J 2003/2806; G01J 2003/283;
(Continued)

(56) References Cited

U.S. PATENT DOCUMENTS 5,504,608 A * 4/1996 Neeves .............. G02B 6/29395
398/79
2010/0220377 A1 9/2010 Yamada et al.
(Continued)

FOREIGN PATENT DOCUMENTS

| JP | 2008-026346 | 2/2008 |
|----|-------------|--------|
| JP | 2008-070427 | 3/2008 |
| JP | 2010-008990 | 1/2010 |

OTHER PUBLICATIONS

International Search Report of PCT application No. PCT/JP2021/028235 dated Sep. 28, 2021.

*Primary Examiner* — Dominic J Bologna
(74) *Attorney, Agent, or Firm* — Wenderoth, Lind & Ponack, L.L.P.

(57) ABSTRACT

A filter array includes optical filters arranged in two dimensions. The optical filters include a first filter and a second filter. The first filter includes a first multimode filter having, within a target wavelength range, first peak wavelengths at each of which the optical transmittance is at a local maximum, and a first band-limiting filter having, as a limiting band, a first sub-wavelength range that is a part of the target wavelength range. The second filter includes a second multimode filter having, within the target wavelength range, second peak wavelengths at each of which the optical transmittance is at a local maximum, at least one of the second peak wavelengths being different from the first peak wavelengths, and a second band-limiting filter restricting transmission of light in a second sub-wavelength range that is a part of the target wavelength range and that is different from the first sub-wavelength range.

17 Claims, 34 Drawing Sheets

(51) Int. Cl.
| | | |
|---|---|---|
| *G01J 3/36* | (2006.01) | |
| *G01J 3/51* | (2006.01) | |
| *G02B 5/20* | (2006.01) | |
| *G02B 5/26* | (2006.01) | |
| *G02B 5/28* | (2006.01) | |
| *H04N 23/12* | (2023.01) | |
| *H04N 25/13* | (2023.01) | |
| *H10F 39/00* | (2025.01) | |

(52) U.S. Cl.
CPC .............. *G02B 5/20* (2013.01); *G02B 5/201* (2013.01); *G02B 5/26* (2013.01); *G02B 5/28* (2013.01); *G02B 5/288* (2013.01); *H04N 25/134* (2023.01); *H10F 39/8053* (2025.01); *G01J 2003/2806* (2013.01); *G01J 2003/2826* (2013.01); *G01J 2003/283* (2013.01); *G01J 2003/516* (2013.01); *H04N 23/12* (2023.01)

(58) Field of Classification Search
CPC ........ G01J 2003/516; G01J 3/36; G01J 3/513; G02B 5/201; G02B 5/20; G02B 5/26; G02B 5/28; G02B 5/288; H01L 27/14621; H04N 25/134; H04N 23/12
See application file for complete search history.

(56) References Cited

U.S. PATENT DOCUMENTS

| | | |
|---|---|---|
| 2014/0175265 A1 | 6/2014 | Gonzalez et al. |
| 2015/0206912 A1* | 7/2015 | Kanamori ......... H01L 27/14621 359/485.05 |
| 2016/0094308 A1* | 3/2016 | Liboiron-Ladouceur .................... H04J 14/02 398/44 |
| 2016/0138975 A1 | 5/2016 | Ando et al. |
| 2019/0025482 A1* | 1/2019 | Lee ......................... G05B 23/02 |
| 2020/0109991 A1* | 4/2020 | Tack ........................ G01J 3/26 |

* cited by examiner

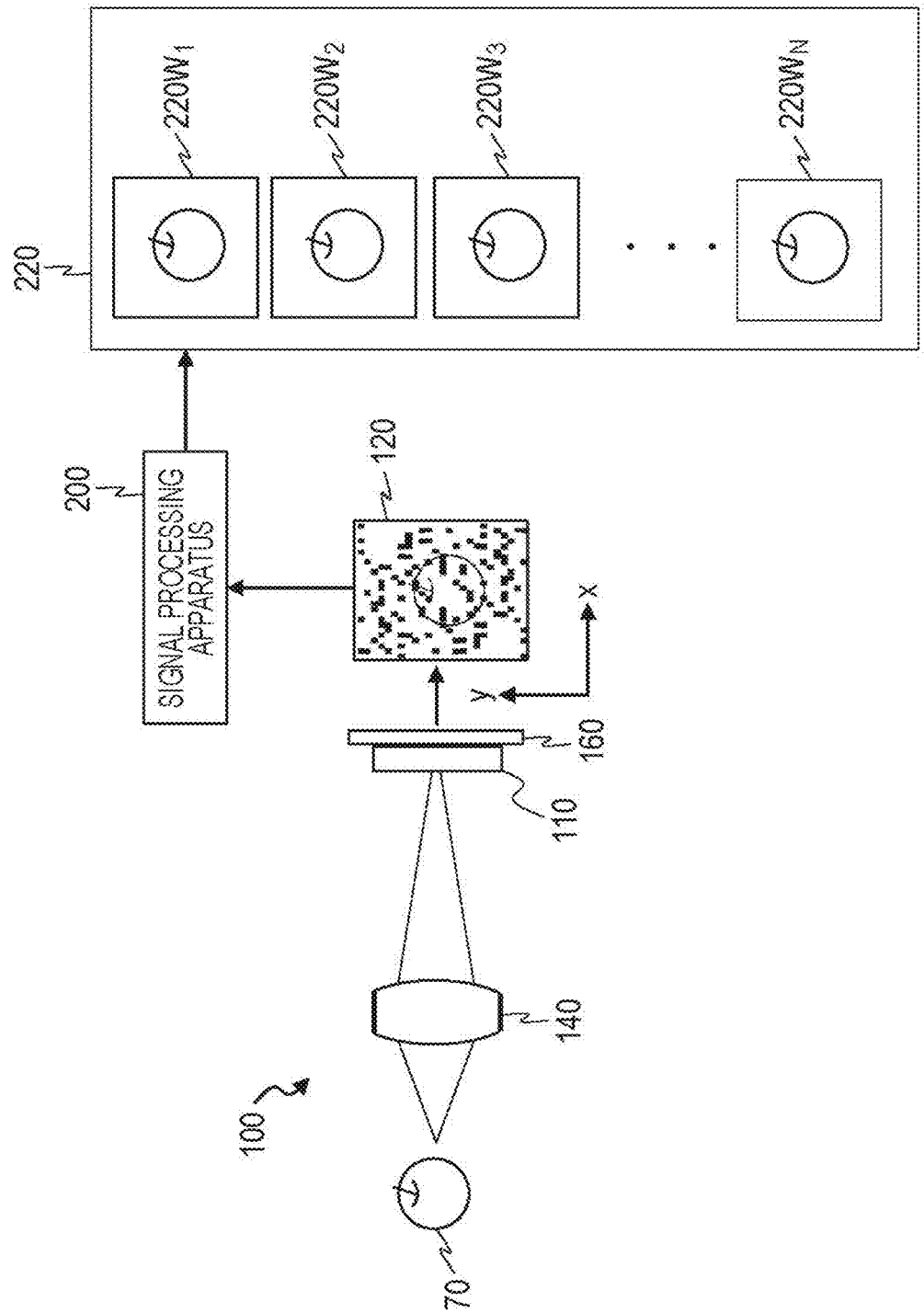

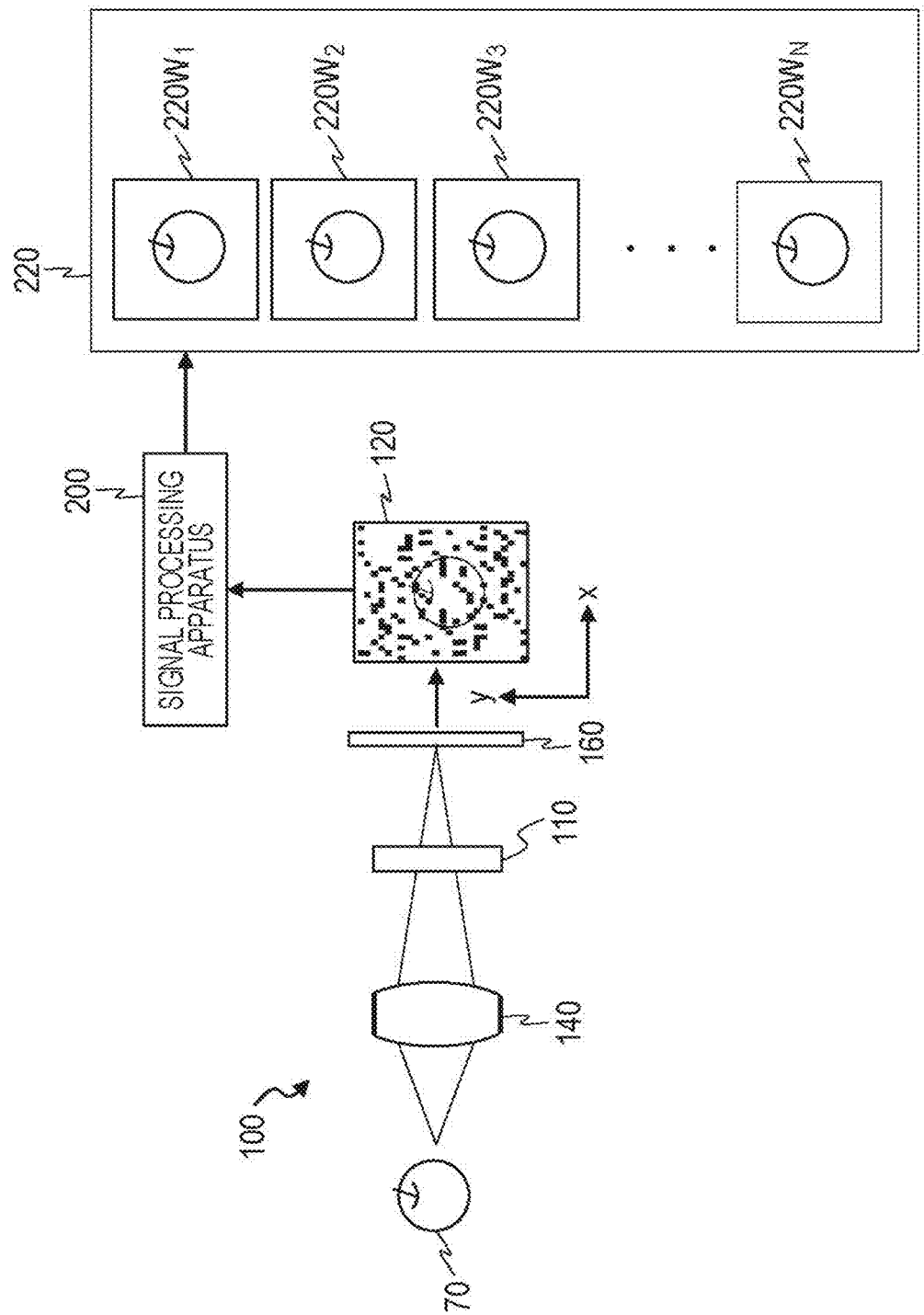

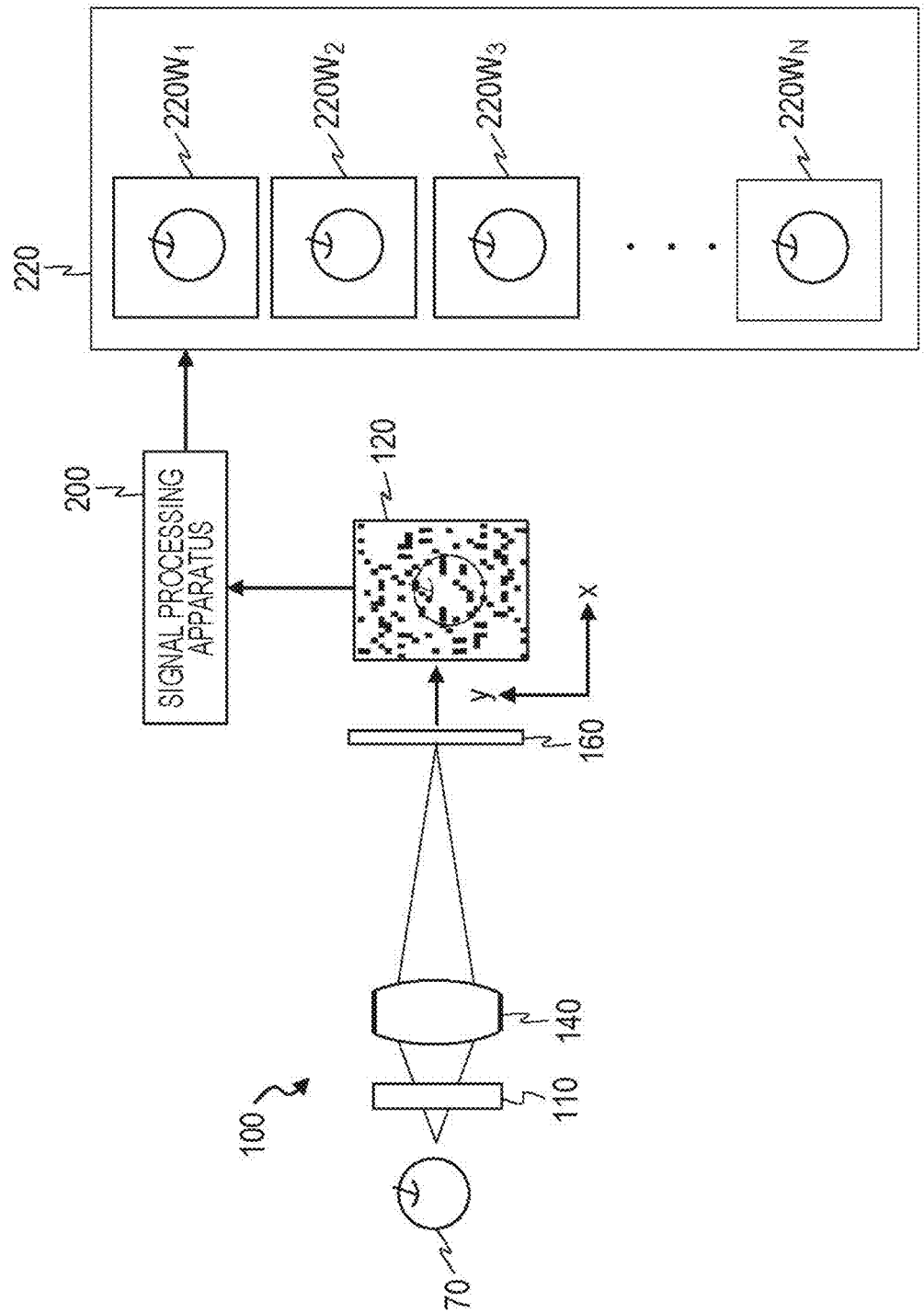

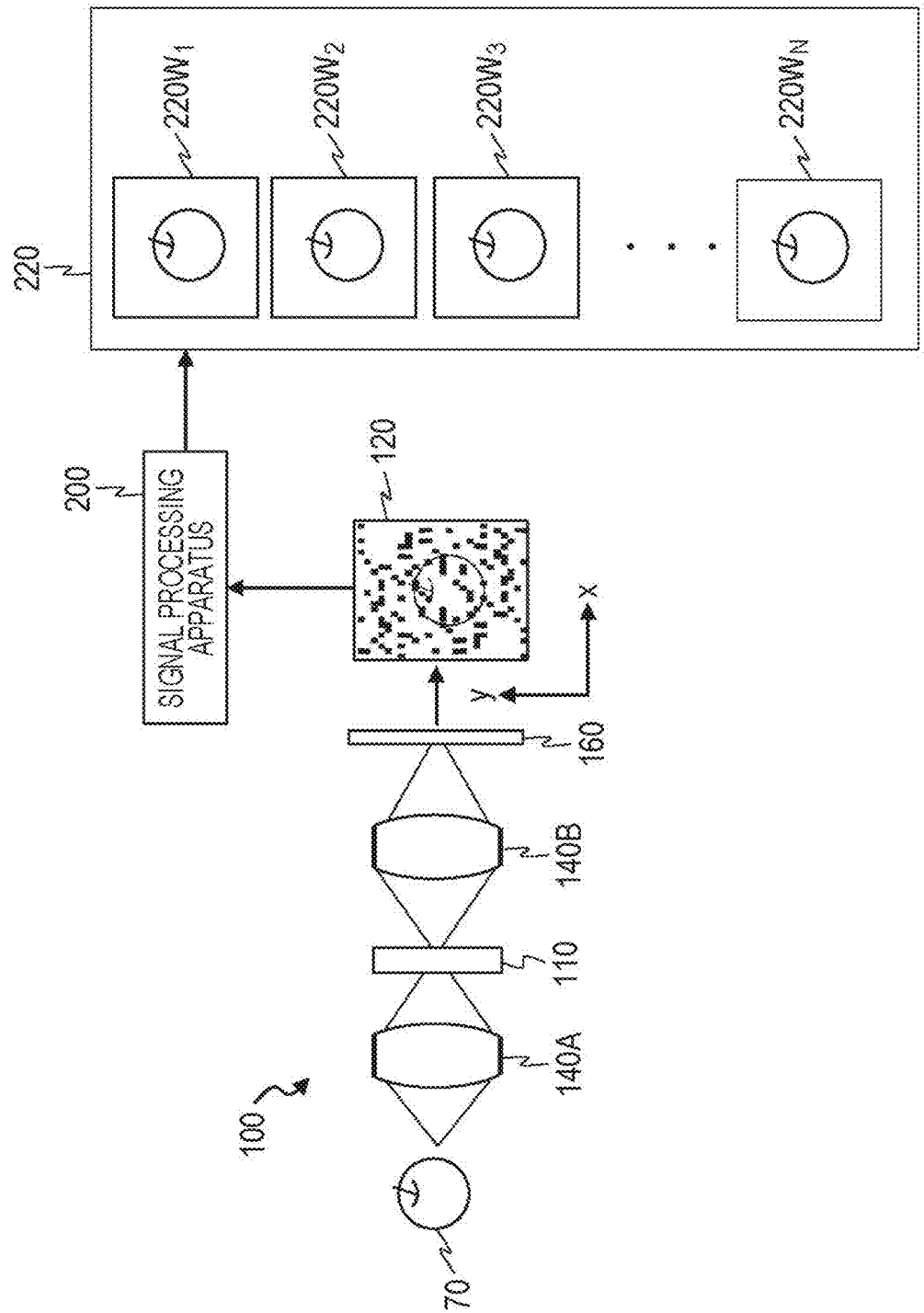

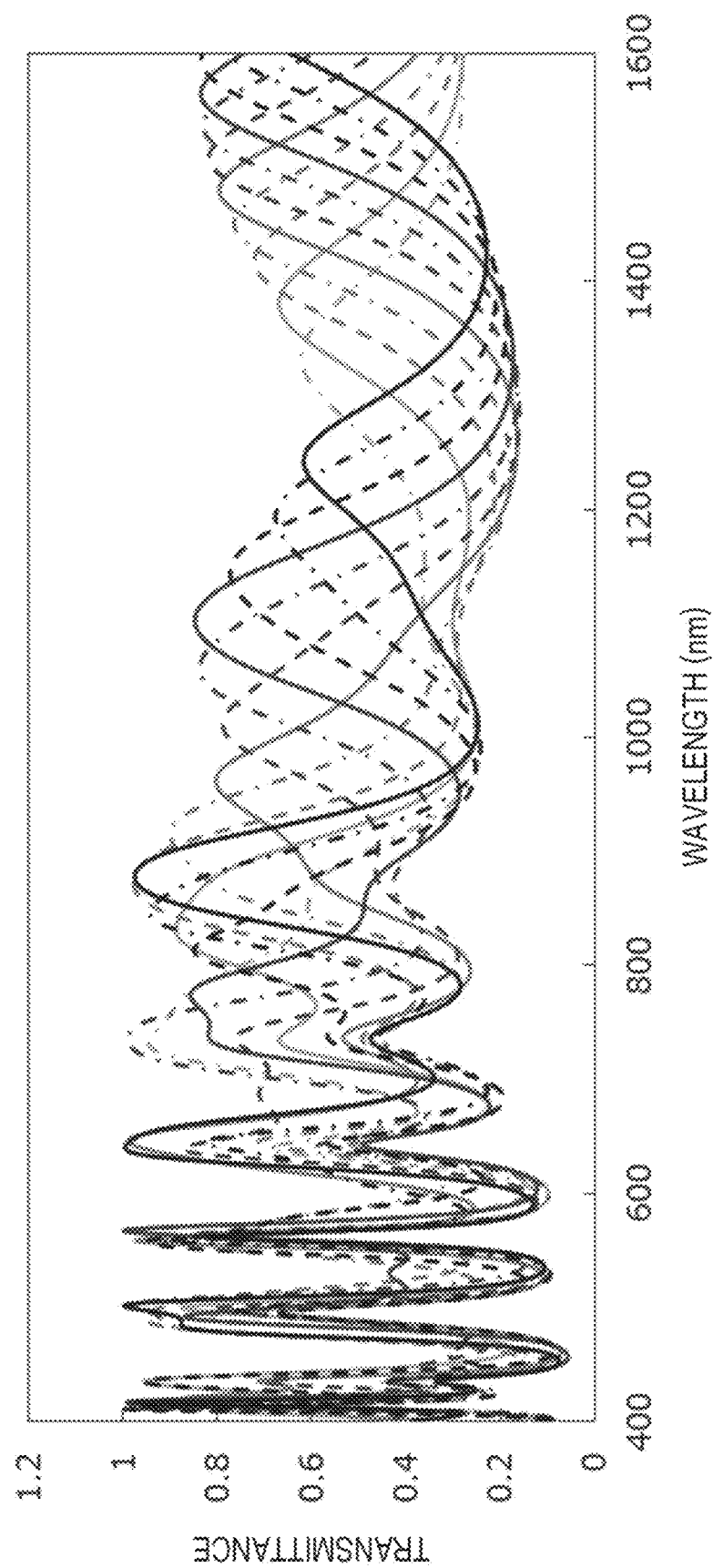

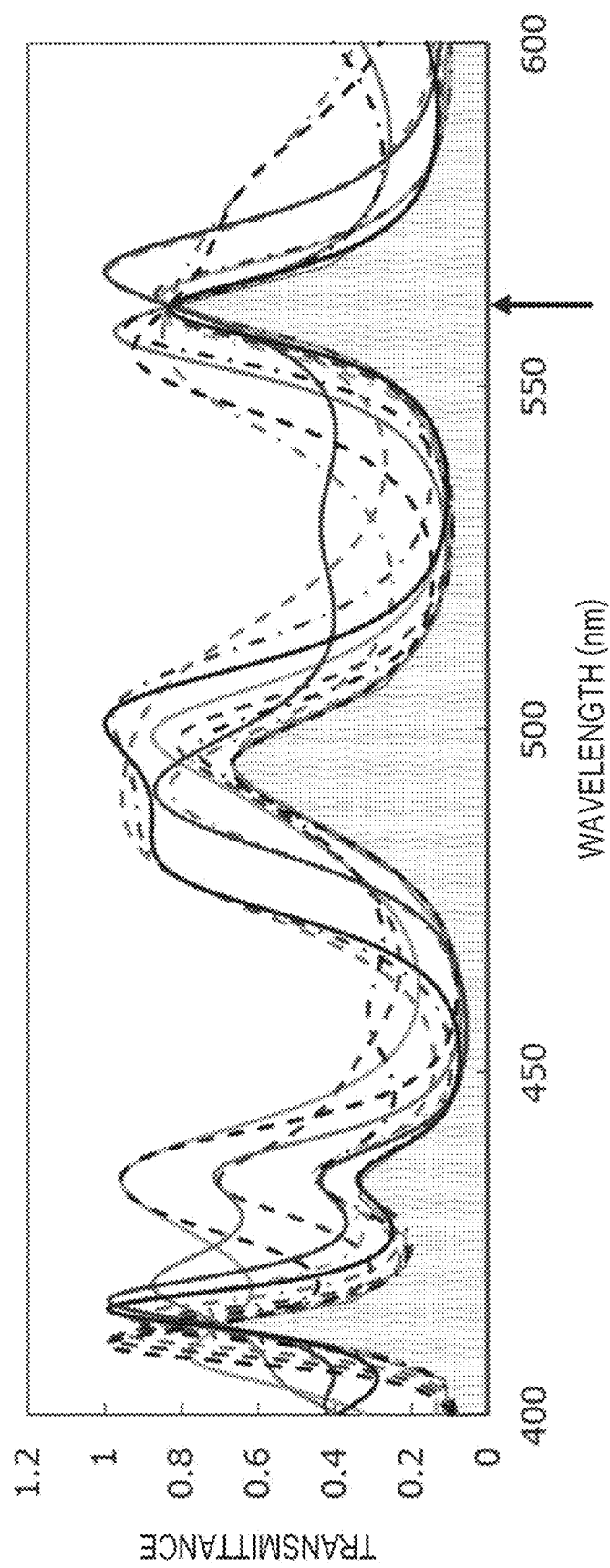

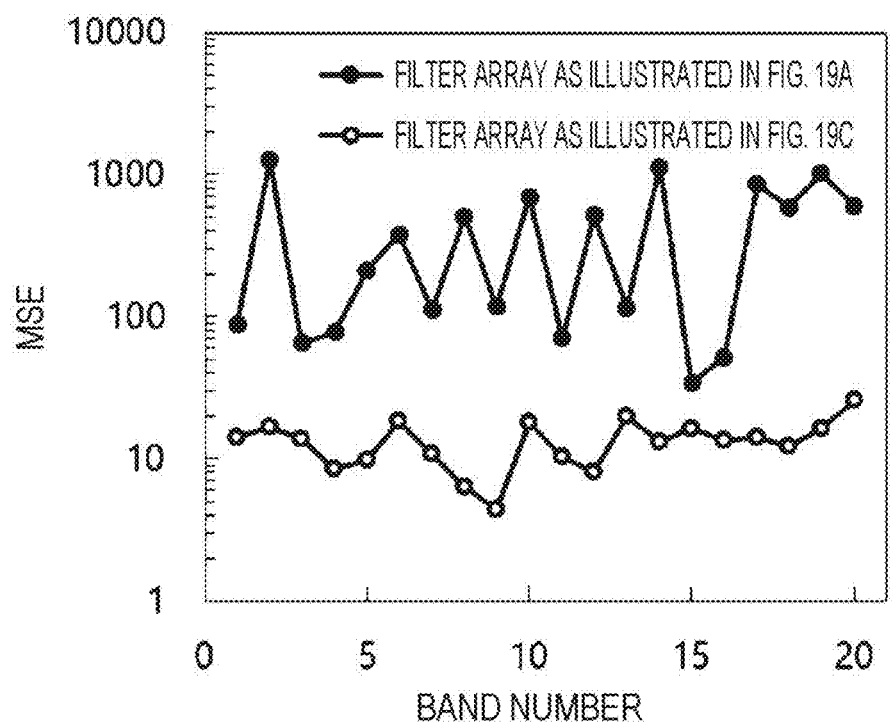
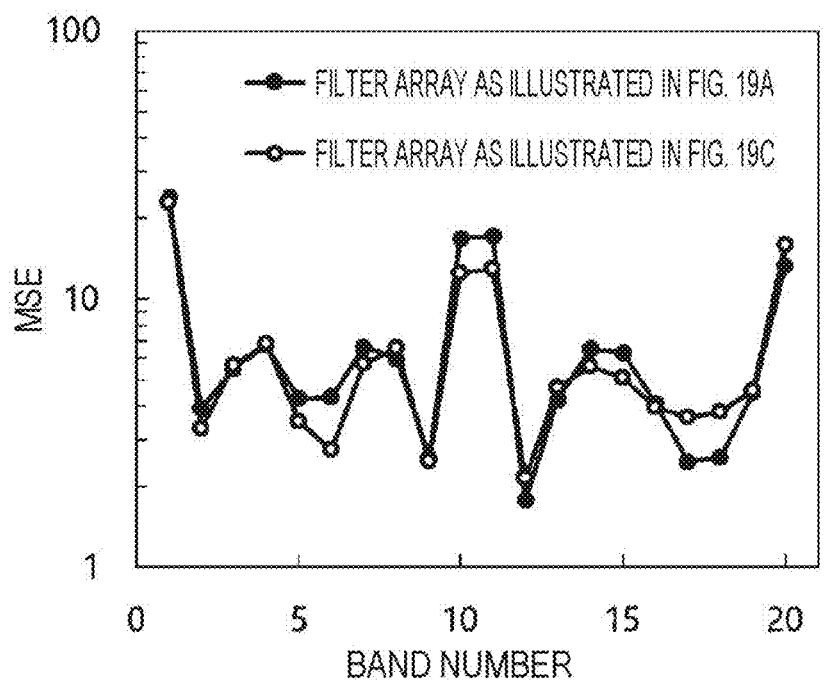

FILTER ARRAY AND IMAGING SYSTEM

BACKGROUND

1. Technical Field

The present disclosure relates to a filter array and an imaging system.

2. Description of the Related Art

Specific properties of a target object that are unable to be grasped with RGB images of the related art can be grasped by using spectral information relating to a large number of bands, such as several tens of bands, each of which is a narrowband. A camera that acquires such multi-wavelength information is called "hyperspectral camera" Hyperspectral cameras are used in various fields including food inspections, biopsies, drug development, and mineral component analyses.

U.S. Pat. No. 9,599,511 discloses an example hyperspectral imaging apparatus using compressed sensing. The imaging apparatus includes a coding element that is an array of optical filters having optical transmittances whose wavelength dependence differs among the optical filters, an image sensor that detects light having passed through the coding element, and a signal processing circuit. The coding element is disposed on an optical path that connects a subject and the image sensor. The image sensor simultaneously detects, at each of the pixels, the light in which components in wavelength bands are superimposed on one another, thereby acquiring one wavelength-multiplexed image. The signal processing circuit applies compressed sensing to the acquired wavelength-multiplexed image by using information about the spatial distribution of the spectral transmittance of the coding element to generate image data for each of the wavelength bands. The imaging apparatus disclosed in U.S. Pat. No. 9,599,511 includes, as the coding element, a filter array having two or more peaks (that is, local maxima) of the transmittance within a target wavelength range.

U.S. Pat. No. 9,466,628 discloses an example filter array that includes Fabry-Perot resonators each including dielectric multilayer films as reflective layers. Japanese Unexamined Patent Application Publication No. 2008-070427 discloses a structure of an optical filter including a diffraction grating. Japanese Unexamined Patent Application Publication No. 2010-008990 discloses a structure of an optical filter using surface plasmon resonance.

SUMMARY

One non-limiting and exemplary embodiment provides a technique for acquiring hyperspectral information having a smaller error throughout a broader wavelength range than in the related art.

In one general aspect, the techniques disclosed here feature a filter array including optical filters that are arranged in two dimensions. The optical filters include a first filter and a second filter. The first filter includes a first multimode filter that has, within a target wavelength range, first peak wavelengths at each of which an optical transmittance is at a local maximum, and a first band-limiting filter that restricts transmission of light in a first sub-wavelength range that is a part of the target wavelength range. The second filter includes a second multimode filter that has, within the target wavelength range, second peak wavelengths at each of which an optical transmittance is at a local maximum, at least one of the second peak wavelengths being different from the first peak wavelengths, and a second band-limiting filter that restricts transmission of light in a second sub-wavelength range that is a part of the target wavelength range and that is different from the first sub-wavelength range.

According to one aspect of the present disclosure, it is possible to acquire hyperspectral information having a smaller error throughout a broader wavelength range than in the related art.

It should be noted that general or specific embodiments of the present disclosure may be implemented as a system, an apparatus, a method, an integrated circuit, a computer program, a computer-readable storage medium such as a storage disk, or any selective combination thereof. A computer-readable storage medium can include, for example, a non-volatile storage medium such as a CD-ROM (compact disc read-only memory). An apparatus may be constituted by one or more apparatuses. When an apparatus is constituted by two or more apparatuses, the two or more apparatuses may be disposed in one device or may be separately disposed in two or more separate devices. In the specification and the claims, "apparatus" can mean not only a single apparatus but also a system constituted by apparatuses.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 1A is a diagram schematically illustrating an example of an imaging system;

FIG. 1B is a diagram illustrating another example of the imaging system;

FIG. 1C is a diagram illustrating yet another example of the imaging system;

FIG. 1D is a diagram illustrating yet another example of the imaging system;

FIG. 9A is a diagram illustrating example transmission spectra of eight types of filters included in the filter array;

FIG. 9B is an enlarged diagram of the transmission spectra in a wavelength range from 400 nm to 600 nm in FIG. 9A;

FIG. 20A is a diagram illustrating the result of calculating the mean squared error (MSE) in an image reconstructed for each of the bands;

FIG. 20B is a diagram illustrating the result of calculating the mean squared error (MSE) in an image reconstructed for each of the bands;

DETAILED DESCRIPTIONS

Figure 2A:
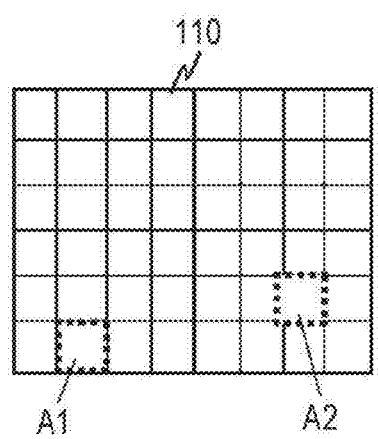
FIG. 2A is a diagram schematically illustrating an example of a filter array.

Any of the embodiments described below is a general or specific example. Numerical values, forms, materials, constituent elements, the dispositions, positions, and connections of constituent elements, steps, and the order of steps described in the following embodiments are illustrative and are not intended to limit the technique of the present disclosure. Among the constituent elements described in the following embodiments, a constituent element not described in an independent claim stating the most generic concept will be described as an optional constituent element. Each of the diagrams is a schematic diagram and is not necessarily a precise diagram. Further, in the diagrams, constituent elements that are substantially the same or similar to each other are assigned the same reference numerals. A duplicated description may be omitted or briefly given.

In the present disclosure, all or some of the circuits, units, apparatuses, members, or sections or all or some of the functional blocks in a block diagram can be implemented as, for example, one or more electronic circuits that include a semiconductor device, a semiconductor integrated circuit (IC), or an LSI (large scale integration) circuit. An LSI circuit or an IC may be integrated into a single chip or may be constituted by a combination of chips. For example, functional blocks other than a memory cell may be integrated into a single chip. Although an LSI circuit or an IC is mentioned here, a circuit may be called differently depending on the degree of integration, and a system LSI circuit, a VLSI (very large scale integration) circuit, or a ULSI (ultra large scale integration) circuit may be used. A field-programmable gate array (FPGA) that can be programmed after LSI manufacturing or a reconfigurable logic device that allows reconfiguration of the connections inside the LSI circuit or setup of circuit cells inside the LSI circuit can be used for the same purpose.

Further, all or some of the functions or operations of any circuit, unit, apparatus, member, or section can be implemented as software processing. In this case, software is recorded to one or more ROMs, optical disks, hard disk drives, or other non-transitory recording media, and when the software is executed by a processor, functions implemented as the software are executed by the processor and a peripheral device. A system or an apparatus may include one or more non-transitory recording media to which the software is recorded, the processor, and a necessary hardware device, such as an interface.

EMBODIMENTS

Hereinafter, an example configuration of an imaging system according to an embodiment of the present disclosure will be described.

Imaging System

FIG. 1A is a diagram schematically illustrating an example of a hyperspectral imaging system. This system includes an imaging apparatus 100 and a signal processing apparatus 200. The imaging apparatus 100 has a configuration similar to that of the imaging apparatus disclosed in U.S. Pat. No. 9,599,511. The imaging apparatus 100 includes an optical system 140, a filter array 110, and an image sensor 160. The filter array 110 has a structure and functions similar to those of the coding element disclosed in U.S. Pat. No. 9,599,511. The optical system 140 and the filter array 110 are disposed on the optical path of incident light from a target object 70 that is a subject. The filter array 110 is disposed between the optical system 140 and the image sensor 160.

FIG. 1A illustrates an apple as an example of the target object 70. The target object 70 is not limited to an apple and can be any object. The image sensor 160 generates data of a compressed image 120 that is a two-dimensional monochrome image including compressed information relating to wavelength bands. On the basis of the data of the compressed image 120 generated by the image sensor 160, the signal processing apparatus 200 generates image data for each of the wavelength bands that are included in a wavelength range set in advance (hereinafter referred to as "target wavelength range"). The generated image data relating to each of the wavelength bands is referred to as "hyperspectral image data" in the specification. The number of the wavelength bands included in the target wavelength range is denoted by N (N is an integer greater than or equal to 4). In the following description, generated pieces of image data relating to the wavelength bands are referred to as hyperspectral images $220W_1$, $220W_2$, $220W_3$, ..., $220W_N$, and these may be collectively referred to as hyperspectral images 220. In the specification, signals representing an image, that is, a set of signals indicating the pixel values of respective pixels, may be simply referred to as "image".

The filter array 110 is an array of transparent filters arranged in rows and columns. The filters include types of filters having different spectral transmittances, that is, having optical transmittances whose wavelength dependence differs among the filters. The filter array 110 modulates the intensity of incident light for each of the wavelengths and outputs the result. This process in the filter array 110 is referred to as "coding" in the specification.

As illustrated in FIG. 1A, the filter array 110 can be disposed in proximity to or directly on the image sensor 160. The term "in proximity to" means a state in which the filter array 110 and the image sensor 160 are in proximity to each other such that an image of light from the optical system 140 having sharpness to some extent is formed on the surface of the filter array 110. The term "directly on" means a state in which the filter array 110 and the image sensor 160 are in proximity to each other with almost no gap therebetween. The filter array 110 and the image sensor 160 may be integrated into a single device.

The optical system 140 includes at least one lens. Although FIG. 1A illustrates the optical system 140 as a single lens, the optical system 140 may be a combination of lenses. The optical system 140 forms an image on the imaging surface of the image sensor 160 through the filter array 110.

The filter array 110 may be disposed apart from the image sensor 160. FIG. 1B to FIG. 1D are diagrams illustrating example configurations of the imaging apparatus 100 in which the filter array 110 is disposed apart from the image sensor 160. FIG. 1B illustrates an example where the filter array 110 is disposed between the optical system 140 and the image sensor 160 at a position spaced apart from the image sensor 160. FIG. 1C illustrates an example where the filter array 110 is disposed between the target object 70 and the optical system 140. FIG. 1D illustrates an example where the imaging apparatus 100 includes two optical systems 140A and 140B and the filter array 110 is disposed between the optical systems 140A and 140B. As in these examples, an optical system including one or more lenses may be disposed between the filter array 110 and the image sensor 160.

The image sensor 160 is a monochrome photodetector including photodetection elements (also referred to as "pixels" in the specification) arranged in two dimensions. The image sensor 160 can be, for example, a CCD (charge-coupled device) sensor, a CMOS (complementary metal-oxide semiconductor) sensor, or an infrared array sensor. Depending on the use, a terahertz array sensor or a millimeter-wave array sensor may be used. The photodetection elements each include, for example, a photodiode. The image sensor 160 need not be a monochrome sensor. For example, a color sensor including an R/G/B filter, an R/G/B/IR filter, or an R/G/B/W filter may be used. When a color sensor is used, the amount of information about wavelengths can be increased and the accuracy of reconstruction of the hyperspectral images 220 can be improved. The acquisition-target wavelength range may be determined as desired, is not limited to the visible wavelength range, and may be the ultraviolet, near-infrared, mid-infrared, far-infrared, microwave, or radio-wave wavelength range.

The signal processing apparatus 200 is a computer that includes a processor and a storage medium such as a memory. The signal processing apparatus 200 can be connected to the imaging apparatus 100 by wire or wirelessly. The signal processing apparatus 200 generates, on the basis of the compressed image 120 acquired by the image sensor 160, pieces of data of the hyperspectral images $220W_1$, $220W_2$, $220W_3$, ..., $220W_N$ respectively including pieces of information relating to the wavelength bands. The details of the processing by the signal processing apparatus 200 will be described below. Note that the signal processing apparatus 200 may be integrated into the imaging apparatus 100. The signal processing apparatus 200 may be connected to the imaging apparatus 100 over a network such as the Internet.

Filter Array

FIG. 2A is a diagram schematically illustrating an example of the filter array 110. The filter array 110 has regions that are arranged in two dimensions. In the specification, the regions may be referred to as "cells". In each of the regions, an optical filter having a spectral transmittance that is individually set is disposed. The spectral transmittance is expressed by a function $T(\lambda)$, where $\lambda$ denotes the wavelength of incident light. The spectral transmittance $T(\lambda)$ can have a value greater than or equal to 0 and less than or equal to 1.

In the example illustrated in FIG. 2A, the filter array 110 has 48 rectangular regions arranged in six rows and eight columns. However, this is only an example, and more than 48 regions can be provided in actual use. The number of regions may be, for example, about the same as the number of pixels of the image sensor 160. The number of filters included in the filter array 110 is determined, for example, so as to be within a range from several tens to several tens of millions in accordance with the use.

Figure 2B:
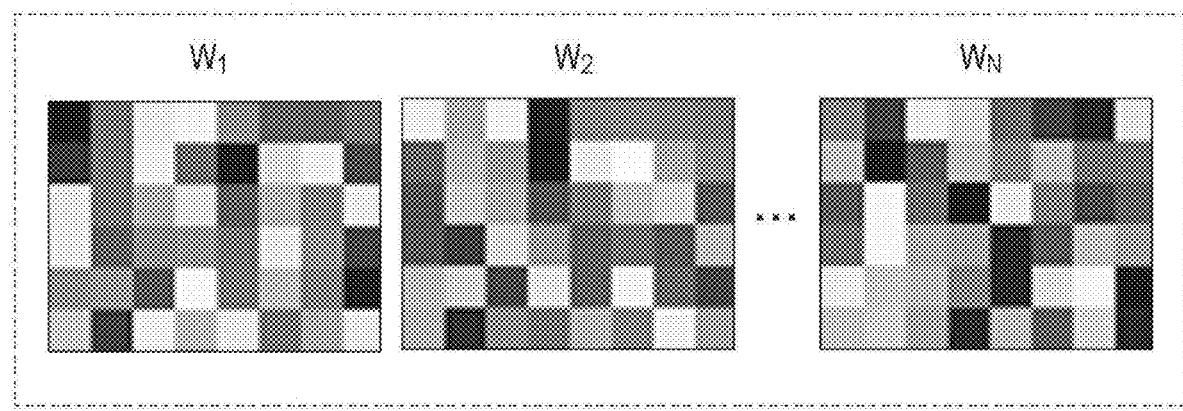
FIG. 2B is a diagram illustrating an example of the spatial distribution of the transmittance of light in each of the wavelength bands included in a target wavelength range in the filter array.

FIG. 2B is a diagram illustrating an example of the spatial distribution of the transmittance of light in each of the wavelength bands $W_1, W_2, \ldots, W_N$ included in the target wavelength range in the filter array 110. In the example illustrated in FIG. 2B, different shades of gray in the regions represent different transmittances. A lighter region has a higher transmittance, and a darker region has a lower transmittance. As illustrated in FIG. 2B, the spatial distribution of the transmittance differs depending on the wavelength band.

Figure 2C:
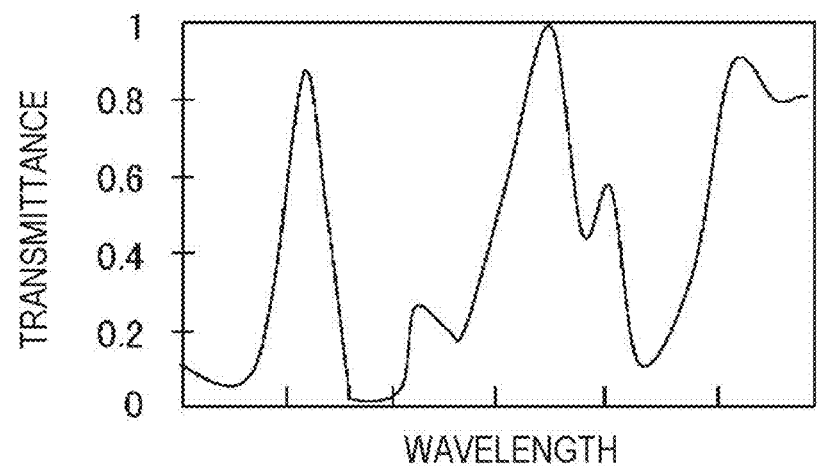
FIG. 2C is a diagram illustrating an example of the spectral transmittance in a region A1 included in the filter array illustrated in FIG. 2A.
Figure 2D:
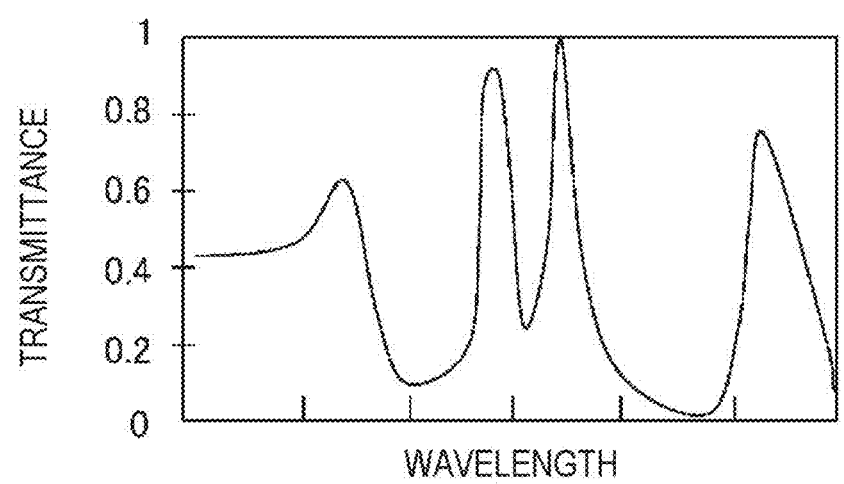
FIG. 2D is a diagram illustrating an example of the spectral transmittance in a region A2 included in the filter array illustrated in FIG. 2A.

FIG. 2C and FIG. 2D are diagrams respectively illustrating examples of the spectral transmittances in a region A1 and a region A2 included in the filter array 110 illustrated in FIG. 2A. The spectral transmittance in the region A1 and the spectral transmittance in the region A2 are different from each other. As described above, the spectral transmittance of the filter array 110 differs depending on the region. However, the spectral transmittances in all regions need not be different from each other. In the filter array 110, the spectral transmittances in at least some of the regions are different from each other. The filter array 110 includes two or more filters having different spectral transmittances. In an example, the number of spectral transmittance patterns in the regions included in the filter array 110 can be greater than or equal to N, which is the number of the wavelength bands included in the target wavelength range. The filter array 110 may be designed such that half or more of the regions have different spectral transmittances.

Figure 3A:
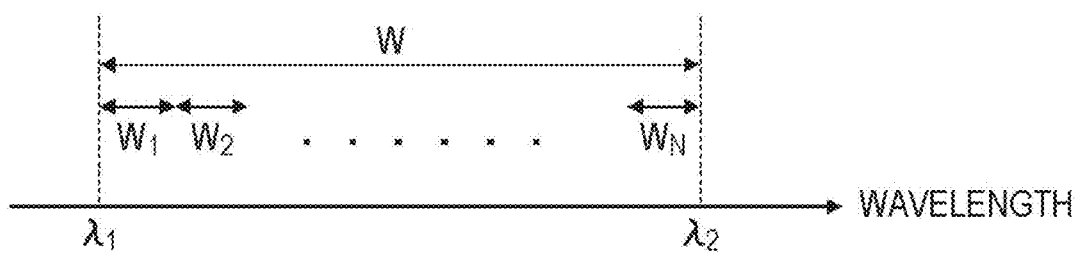
FIG. 3A is a diagram for explaining relationships between the target wavelength range and the wavelength bands included in the target wavelength range.
Figure 3B:
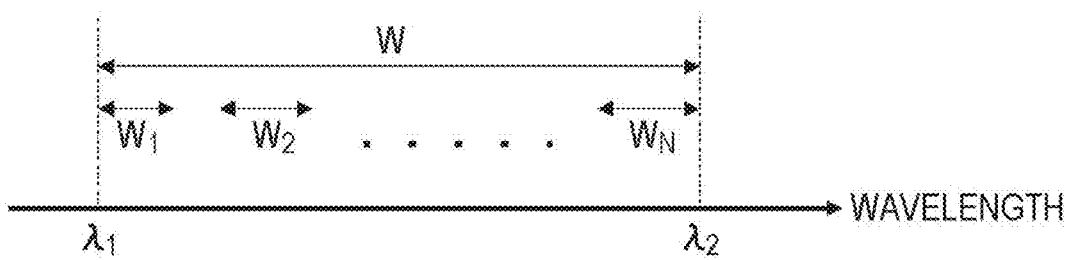
FIG. 3B is a diagram for explaining relationships between the target wavelength range and the wavelength bands included in the target wavelength range.

FIG. 3A and FIG. 3B are diagrams for explaining relationships between the target wavelength range W and the wavelength bands $W_1, W_2, \ldots, W_N$ included in the target wavelength range W. The target wavelength range W can be set to various ranges depending on the use. The target wavelength range W can be, for example, the wavelength range of visible light from about 400 nm to about 700 nm, the wavelength range of near-infrared rays from about 700 nm to about 2500 nm, or the wavelength range of near-ultraviolet rays from about 10 nm to about 400 nm. Alternatively, the target wavelength range W may be the radio-wave range of, for example, mid-infrared rays, far-infrared rays, terahertz waves, or millimeter-waves. As described above, the wavelength range to be used is not limited to the visible-light range. In the specification, not only visible light but also non-visible light including near-ultraviolet rays, near-infrared rays, and radio waves is referred to as "light" for the sake of convenience. In the following description, the shortest wavelength in the target wavelength range W is denoted by Au and the longest wavelength in the target wavelength range W is denoted by $\lambda_2$.

FIG. 3A illustrates an example where the target wavelength range W is divided into N equal wavelength ranges, which are assumed to be the wavelength bands $W_1, W_2, \ldots, W_N$, where N is any integer greater than or equal to 4. However, the wavelength bands are not limited to this example. The wavelength bands included in the target wavelength range W may be set as desired. For example, the bandwidths of some wavelength bands may be made non-uniform. Wavelength bands adjacent to each other may have a gap therebetween or may overlap each other. FIG. 3B illustrates an example where some wavelength bands have different bandwidths and two wavelength bands adjacent to each other have a gap therebetween. As described above, the wavelength bands may be determined as desired as long as the wavelength bands are different from each other.

Figure 4A:
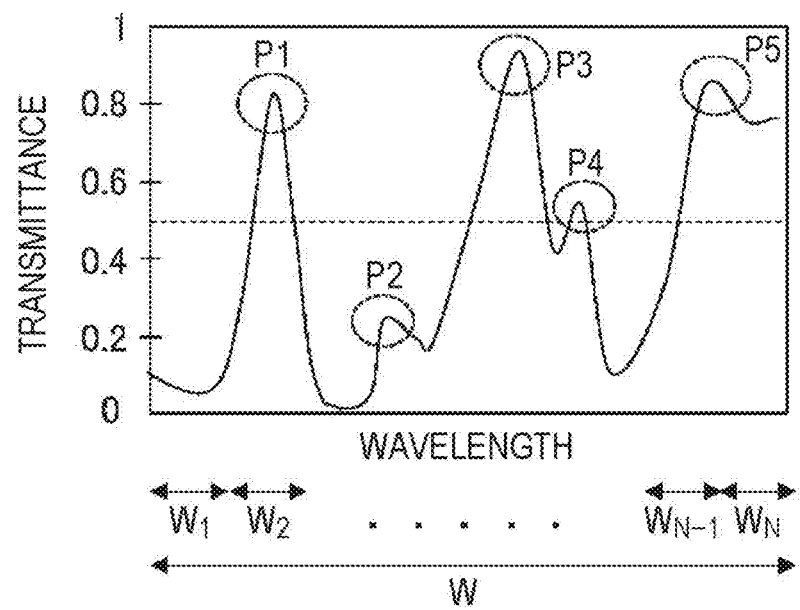
FIG. 4A is a diagram for explaining the characteristics of the spectral transmittance in a region in the filter array.

FIG. 4A is a diagram for explaining the characteristics of the spectral transmittance in a region in the filter array 110. FIG. 4A illustrates an example where the spectral transmittance has local maxima P1 to P5 and local minima at wavelengths within the target wavelength range W. In the example illustrated in FIG. 4A, the optical transmittance is normalized such that the maximum value is equal to 1 and the minimum value is equal to 0 within the target wavelength range W. In the example illustrated in FIG. 4A, the spectral transmittance has a local maximum in wavelength ranges, such as the wavelength band $W_2$ and the wavelength band $W_{N-1}$. As described above, the spectral transmittance of each region has a local maximum in at least two wavelength ranges among the wavelength bands $W_1$ to $W_N$. In the example illustrated in FIG. 4A, the local maxima P1, P3, P4, and P5 are greater than or equal to 0.5.

As described above, the optical transmittance in each region differs depending on the wavelength. Therefore, each region in the filter array 110 allows many components of incident light in some wavelength ranges to pass therethrough and allows few components in the other wavelength ranges to pass therethrough. For example, for light in k wavelength bands among the N wavelength bands, the transmittance can be greater than 0.5, and for light in the remaining N–k wavelength bands, the transmittance can be less than 0.5. Here, k is an integer satisfying $2 \leq k < N$. When incident light is white light that equally includes all wavelength components of visible light, the filter array 110 modulates, in each of the regions, the incident light to a light ray having intensity peaks that are discrete with respect to the wavelength, superimposes these multi-wavelength light rays, and makes the resulting light be incident on the image sensor 160.

Figure 4B:
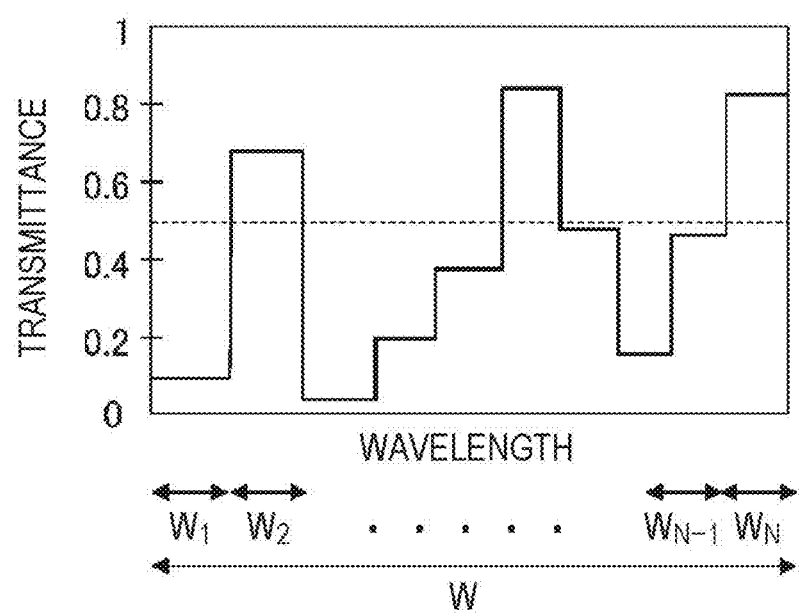
FIG. 4B is a diagram illustrating the result of averaging the spectral transmittance illustrated in FIG. 4A for each of the wavelength bands.

FIG. 4B is a diagram illustrating the result of averaging the spectral transmittance illustrated in FIG. 4A for each of the wavelength bands $W_1, W_2, \ldots, W_N$. The averaged transmittance is acquired by integrating the spectral transmittance $T(\lambda)$ for each wavelength band and dividing the result of integration by the bandwidth of the wavelength band. In the specification, the value of the transmittance thus averaged for each wavelength band is assumed to be the transmittance in the wavelength band. In this example, the transmittance is distinctively high in three wavelength ranges respectively having the local maxima P1, P3, and P5. Specifically, in two wavelength ranges respectively having the local maxima P3 and P5, the transmittance is greater than 0.8.

The resolution of the transmission spectrum of each filter in the filter array 110 in the wavelength direction can be approximately set to the bandwidth of a desired wavelength band. For example, in a wavelength range that includes one local maximum on a transmission spectrum curve, the width of a range in which the transmittance has a value greater than or equal to the average of the local maximum and a local minimum closest to the local maximum can be approximately set as the bandwidth of the desired wavelength band. In this case, when the transmission spectrum is resolved into frequency components by, for example, a Fourier transform, the values of the frequency component corresponding to the wavelength ranges are relatively large.

The filter array 110 typically includes plural filters in grid-like sections as illustrated in FIG. 2A. Some or all of the plural filters have different transmission spectra. The wavelength distribution and spatial distribution of the optical transmittances of the plural filters included in the filter array 110 can be, for example, a random distribution or a quasi-random distribution.

The idea of a random distribution and a quasi-random distribution will be described below. First, each filter in the filter array 110 can be regarded as, for example, a vector element having a value from 0 to 1 in accordance with the optical transmittance. When the transmittance is equal to 0, the value of the vector element is equal to 0, and when the transmittance is equal to 1, the value of the vector element is equal to 1. In other words, a set of filters arranged in a line in the row direction or the column direction can be regarded as a multi-dimensional vector having values from 0 to 1. Therefore, the filter array 110 can be regarded as including multi-dimensional vectors in the column direction or the row direction. In this case, a random distribution means that any two multi-dimensional vectors are independent of each other, that is, are not parallel to each other. A quasi-random distribution means that some of the multi-dimensional vectors are not independent of each other. Therefore, in a random distribution and in a quasi-random distribution, a vector having, as its elements, the values of the transmittance of light in a wavelength band, of filters belonging to a set of filters arranged in a row or column included in the plural filters and a vector having, as its elements, the values of the transmittance of light in the wavelength band, of filters belonging to a set of filters arranged in another row or column included in the plural filters are independent of each other. Similarly, for any other wavelength band different from the above-described wavelength band, a vector having, as its elements, the values of the transmittance of light in the other wavelength band, of filters belonging to a set of filters arranged in a row or column included in the plural filters and a vector having, as its elements, the values of the transmittance of light in the other wavelength band, of filters belonging to a set of filters arranged in another row or column included in the plural filters are independent of each other.

When the filter array 110 is disposed in proximity to or directly on the image sensor 160, the spacing between the plural filters included in the filter array 110 may be made to approximately match with the pitch between the pixels of the image sensor 160. In this case, the resolution of a coded image of outgoing light from the filter array 110 approximately matches with the resolution of the pixels. When light having passed through each of the filters is made to be incident only on a corresponding one of the pixels, an operation described below can be facilitated. When the filter array 110 is disposed apart from the image sensor 160, the pitch between the filters can be made smaller in accordance with the distance.

The example illustrated in FIG. 2A to FIG. 2D assumes a gray-scale transmittance distribution in which the transmittance in each of the regions can have any value greater than or equal to 0 and less than or equal to 1. However, the gray-scale transmittance distribution need not be employed. For example, a binary-scale transmittance distribution in which the transmittance in each of the regions can have either a value of about 0 or a value of about 1 may be employed. In a binary-scale transmittance distribution, each of the regions allows most of the light in at least two wavelength bands among the wavelength bands included in the target wavelength range to pass therethrough and does not allow most of the light in the remaining wavelength ranges to pass therethrough. Here, "most" means approximately 80% or more.

Among all the filters, some of the filters, that is, for example, half of the filters, may be replaced by transparent regions. The transparent regions allow light in all the wavelength bands $W_1$ to $W_N$ included in the target wavelength range W to pass therethrough to a similar extent at a high transmittance, that is, at a transmittance of, for example, 80% or higher. In this configuration, the transparent regions can be disposed in, for example, a checkerboard pattern. That is, in each of the two directions in which the regions are arranged in the filter array 110, regions having an optical transmittance that differs depending on the wavelength and transparent regions can be alternately arranged.

Data that indicates the spatial distribution of the spectral transmittance of the filter array 110 as described above can be acquired in advance on the basis of design data or actual measurement calibration and stored in the storage medium included in the signal processing apparatus 200. This data is used in an operation process described below.

Each filter in the filter array 110 has, within the target wavelength range W, peak wavelengths at each of which a local maximum appears. In the following description, such a filter may be referred to as "multimode filter". The multimode filter can be formed by, for example, using a very small structure that includes at least one of a multilayer film, an organic material, a diffraction grating structure, or metal. In a case of using a multilayer film, for example, a multilayer film that includes a dielectric multilayer film or a metal layer can be used. In this case, at least one of the thickness of each layer of the multilayer film, the material of each layer of the multilayer film, or the order in which the layers are stacked differs depending on the filter. Accordingly, a spectral characteristic that differs depending on the filter can be attained. The use of a multilayer film can attain a sharp rise and a sharp fall in the spectral transmittance. A configuration using an organic material can be implemented by making a contained pigment or dye differ depending on the filter or by stacking different types of materials. A configuration using a diffraction grating structure can be implemented by providing a diffraction structure having a diffraction pitch or depth that differs depending on the filter. In a case of using a very small structure including metal, a multimode filter can be manufactured by using a spectrum caused by a plasmon effect.

Example of Signal Processing

Now, an example of signal processing by the signal processing apparatus 200 will be described. The signal processing apparatus 200 reconstructs the multi-wavelength hyperspectral images 220 on the basis of the compressed image 120 output from the image sensor 160 and the spatial-distribution characteristic of the transmittance of the filter array 110 at each wavelength. Here, "multi-wavelength" means, for example, a number of wavelength ranges larger than the number of wavelength ranges of three colors, namely, R, G, and B, acquired by a usual color camera. The number of wavelength ranges can be a number, for example, from 4 to about 100. The number of wavelength ranges is referred to as the number of bands. The number of bands may be greater than 100 depending on the use.

Data to be calculated is data of the hyperspectral images 220, and the data is denoted by f. When the number of bands is denoted by N, f is data acquired by combining pieces of image data $f_1, f_2, \ldots, f_n$ relating to the respective bands. Here, as illustrated in FIG. 1A, the lateral direction of the image is assumed to be an x direction and the longitudinal direction of the image is assumed to be a y direction. When the number of pixels, in the x direction, of the image data to be calculated is denoted by n and the number of pixels, in the y direction, thereof is denoted by m, each of the pieces of image data $f_1, f_2, \ldots, f_n$ is two-dimensional data having n×m pixels. Therefore, the data f is three-dimensional data having n×m×N elements. This three-dimensional data is referred to as "hyperspectral image data" or "hyperspectral data cube".

In contrast, the number of elements of data g of the compressed image 120 acquired by coding and multiplexing by the filter array 110 is equal to n×m. The data g is expressed by expression (1) below.

$$g = Hf = H \begin{bmatrix} f_1 \\ f_2 \\ \vdots \\ f_N \end{bmatrix} \quad (1)$$

Here, each of $f_1, f_2, \ldots, f_n$ is data having n×m elements. Therefore, to be exact, the vector on the right-hand side is a one-dimensional vector having n×m×N rows and one column. The vector g is transformed to and expressed by a one-dimensional vector having n×m rows and one column and calculated. The matrix H expresses a transform in which the components $f_1, f_2, \ldots, f_n$ of the vector f are coded with coding information (also referred to as "mask information") that differs depending on the wavelength band and are subjected to intensity modulation, and the resulting components are added together. Therefore, H is a matrix having n×m rows and n×m×N columns.

When the vector g and the matrix H are given, f can seem to be calculated by solving the inverse problem of expression (1). However, the number of elements n×m×N of the data f to be calculated is larger than the number of elements n×m of the acquired data g, and therefore, this problem is an ill-posed problem and is unable to be solved as is. Accordingly, the signal processing apparatus 200 uses redundancy of the images included in the data f and calculates a solution by using a compressed sensing technique. Specifically, the data f to be calculated is estimated by solving expression (2) below.

$$f' = \arg\min_{f} \{\|g - Hf\|_{l_2} + \tau\Phi(f)\} \quad (2)$$

Here, f' denotes the estimated data f. The first term in the curly brackets in the above expression represents the amount of deviation of the estimation result Hf from the acquired data g, that is, a residual term. Although the residual term is the sum of squares here, the residual term may be, for example, the absolute value or the square root of the sum of squares. The second term in the curly brackets is a regularization term or a stabilization term. Expression (2) means calculation of f with which the sum of the first term and the second term is minimized. The signal processing apparatus 200 can converge the solution by recursive iterative operations and calculate the final solution f'.

The first term in the curly brackets in expression (2) means an operation of calculating the sum of squares of the differences between the acquired data g and Hf acquired by transforming f in the process of estimation by using the matrix H. In the second term, $\Phi(f)$ is a constraint condition in regularization of f and is a function that reflects sparse information about the estimated data. This function brings an effect of smoothing or stabilizing the estimated data. The regularization term can be expressed by, for example, a discrete cosine transform (DCT), a wavelet transform, a Fourier transform, or total variation (TV) of f. For example, when total variation is used, stable estimated data, the effect of noise of the observation data g on the data being reduced, can be acquired. The sparse characteristic of the target object 70 in the spaces of regularization terms differs depending on the texture of the target object 70. A regularization term with which the texture of the target object 70 becomes sparser in the space of the regularization term may be selected. Alternatively, plural regularization terms may be included in the operation. $\tau$ is a weighting coefficient. As the weighting coefficient $\tau$ increases, the amount of reduction of redundant data increases and the compression ratio increases. As the weighting coefficient $\tau$ decreases, convergence to the solution becomes weaker. The weighting coefficient $\tau$ is set to an appropriate value with which f is converged to some extent and the data is not excessively compressed.

Note that with the configuration illustrated in FIGS. 1B and 1n FIG. 1C, an image coded by the filter array 110 and acquired by the image sensor 160 is blurred on the imaging surface of the image sensor 160. Therefore, when information about such blurring is retained in advance and the blurring information is reflected to the matrix H described above, the hyperspectral images 220 can be reconstructed. Here, the blurring information is expressed by a point spread function (PSF). A PSF is a function of defining the degree of the spread of a point image to neighboring pixels. For example, when a point image corresponding to one pixel on an image spreads to a region of k×k pixels around the pixel due to blurring, the PSF can be defined as a group of coefficients, namely, a matrix, that indicates an effect on the luminance of each pixel within the region. When the effect of blurring on the coding pattern, expressed by the PSF is reflected to the matrix H, the hyperspectral images 220 can be reconstructed. Although the position at which the filter array 110 is disposed is determined as desired, a position at which excessive spread or loss of the coding pattern of the filter array 110 does not occur can be selected.

Although an example operation using compressed sensing expressed by expression (2) has been described above, another method may be used to calculate a solution. For example, another statistical method, such as maximum likelihood estimation or Bayes estimation, can be used. The number of the hyperspectral images 220 may be any desired number, and the wavelength ranges may be set as desired. The details of the method for reconstruction are disclosed in U.S. Pat. No. 9,599,511. The entire content of disclosure in U.S. Pat. No. 9,599,511 is incorporated herein by reference.

Filter Array Including Fabry-Perot Filters

Figure 5:
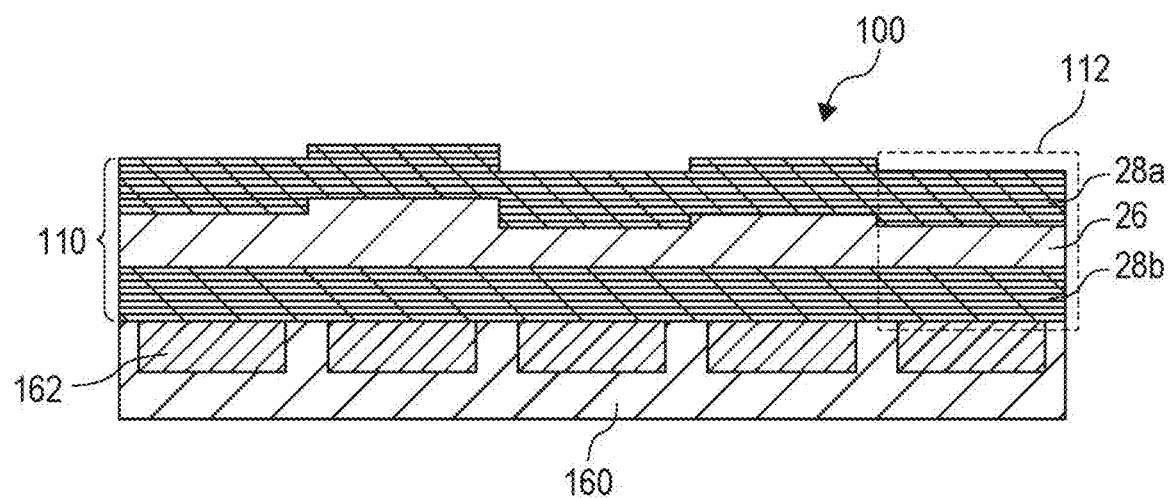
FIG. 5 is a diagram schematically illustrating a part of a cross section of an imaging apparatus in an example.

Now, a specific example of the structure of the filter array 110 will be described with reference to FIG. 5. FIG. 5 is a diagram schematically illustrating a part of a cross section of the imaging apparatus 100 in an example. The imaging apparatus 100 includes the filter array 110 and the image sensor 160. The filter array 110 includes filters 112 arranged in two dimensions. The filters 112 can be arranged in rows and columns. FIG. 5 schematically illustrates a part of the cross-sectional structure of one row.

In the example illustrated in FIG. 5, the filter array 110 is disposed on the surface of the image sensor 160. The image sensor 160 includes photodetection elements 162 each of which is positioned directly under a corresponding one of the filters 112 included in the filter array 110. The filter array 110 and the image sensor 160 may be spaced apart from each other. Even in this case, each photodetection element 162 can be disposed at a position at which the photodetection element 162 receives light having passed through one of the filters 112. The constituent elements described above may be disposed such that light rays having passed through the filters 112 are incident on the corresponding photodetection elements 162 via mirrors not illustrated.

Each of the filters 112 in the filter array 110 illustrated in FIG. 5 is a Fabry-Perot (FP) filter. The FP filter includes two reflective layers, namely, a first reflective layer 28a and a second reflective layer 28b, facing each other and an interference layer 26 (also referred to as "intermediate layer") interposed therebetween. The interference layer 26 has a thickness and a refractive index with which a resonance structure having one or more resonance modes is formed. The transmittance of light having a wavelength corresponding to any of the resonance modes increases, and the transmittance of light having any other wavelength decreases. When the refractive index or the thickness of the interference layer 26 is changed from filter to filter, a transmission spectrum that differs depending on the filter can be attained.

Each of the filters 112 has a resonance structure. The resonance structure means a structure in which light having a specific wavelength forms a standing wave therein and stably exists. The state of this light is referred to as "resonance mode". In the example illustrated in FIG. 5, the first reflective layer 28a, the second reflective layer 28b, and the interference layer 26 constitute the resonance structure. Each of the first reflective layer 28a and the second reflective layer 28b can be formed of, for example, a dielectric multilayer film or a metal thin film. The interference layer 26 can be formed of a dielectric or semiconductor that is substantially transparent in the target wavelength range. The interference layer 26 can be made of, for example, at least one selected from the group consisting of Si, $Si_3N_4$, $TiO_2$, $Nb_2O_5$, and $Ta_2O_5$. At least one of the refractive index or the thickness of the interference layer 26 differs depending on the filter 112. The transmission spectrum of each of the filters 112 has local maxima of the transmittance at wavelengths. These wavelengths correspond to the respective resonance modes of different orders in the resonance structure described above.

All the filters 112 in the filter array 110 may have the resonance structure described above, or the filter array 110 may include a filter not having the resonance structure. For example, the filter array 110 may include a filter, such as a transparent filter or an ND (neutral density) filter, having an optical transmittance that does not depend on the wavelength.

Each of the photodetection elements 162 in the image sensor 160 has sensitivity to light in the target wavelength range W set in advance. Note that in the present disclosure, "having sensitivity" to light in a wavelength range means to have substantial sensitivity necessary for detecting light in the wavelength range, and means, for example, that the external quantum efficiency in the wavelength range is greater than or equal to 1%. The external quantum efficiency of the photodetection elements 162 in the wavelength range may be greater than or equal to 10% or greater than or equal to 20%. All the wavelengths at each of which the optical transmittance of each filter 112 is at a local maximum are included in the target wavelength range W.

In the specification, each filter 112 having the resonance structure as described above is referred to as "Fabry-Perot filter". A Fabry-Perot filter is a type of interference filter. Instead of a Fabry-Perot filter, for example, another type of interference filter, such as a color separation filter constituted by, for example, a diffraction grating and so on, may be used. In the specification, a part of a transmission spectrum in which a local maximum appears is referred to as "peak", and a wavelength, within the target wavelength range W, at which the optical transmittance is at a local maximum is referred to as "peak wavelength".

In each filter 112, the thickness of the interference layer 26 is denoted by L, the refractive index of the interference layer 26 is denoted by n, the angle of incidence of light incident on the filter 112 is denoted by $\theta_i$, and the mode order of the resonance mode is denoted by m, where m is an integer greater than or equal to 1. In this case, the peak wavelength $\lambda_m$ of the transmission spectrum of the filter 112 is expressed by expression (3) below.

$$\lambda_m = \frac{2nL}{m}\sqrt{1-\left(\frac{\sin\theta_i}{n}\right)^2} \quad (3)$$

In the target wavelength range W, the shortest wavelength is denoted by $\lambda_1$ and the longest wavelength is denoted by $\lambda_2$. In the specification, the filter 112 for which only one peak wavelength $\lambda_m$ that satisfies $\lambda_1 \leq \lambda_m \leq \lambda_2$ is present is referred to as "single-mode filter", and the filter 112 for which two or more peak wavelengths $\lambda_m$ that satisfy $\lambda_1 \leq \lambda_m \leq \lambda_2$ are present is referred to as "multimode filter".

An example structure when the shortest wavelength of the target wavelength range W is $\lambda_1=400$ nm and the longest wavelength thereof is $\lambda_2=700$ nm will be described below. When the thickness of the interference layer 26 is L=300 nm and the refractive index of the interference layer 26 is n=1.0, in a case of $\theta_i=0°$ (that is, normal incidence), the peak wavelength in a case of m=1 is equal to 600 nm, and the peak wavelength in a case of m≥2 is less than or equal to 300 nm. Therefore, in this case, the filter 112 is a single-mode filter for which one peak wavelength is included within the target wavelength range W.

In contrast, when the thickness L is further increased, plural peak wavelengths are included within the target wavelength range W. For example, in a case of L=3000 nm, n=1.0, and $\theta_i=0$, the peak wavelength in a case of 1≤m≤8 is greater than or equal to 750 nm, the peak wavelength in a case of 9≤m≤15 is greater than or equal to 400 nm and less than or equal to 700 nm, and the peak wavelength in a case of m≥16 is less than or equal to 375 nm. Therefore, in this case, the filter 112 is a multimode filter for which seven peak wavelengths are included within the target wavelength range W.

As described above, when the thickness of the interference layer 26 of the filter 112 is appropriately designed, a multimode filter can be implemented. Instead of the thickness of the interference layer 26, the refractive index of the interference layer 26 of the filter 112 may be adjusted. Alternatively, both the thickness and the refractive index of the interference layer 26 of the filter 112 may be adjusted.

Figure 6:
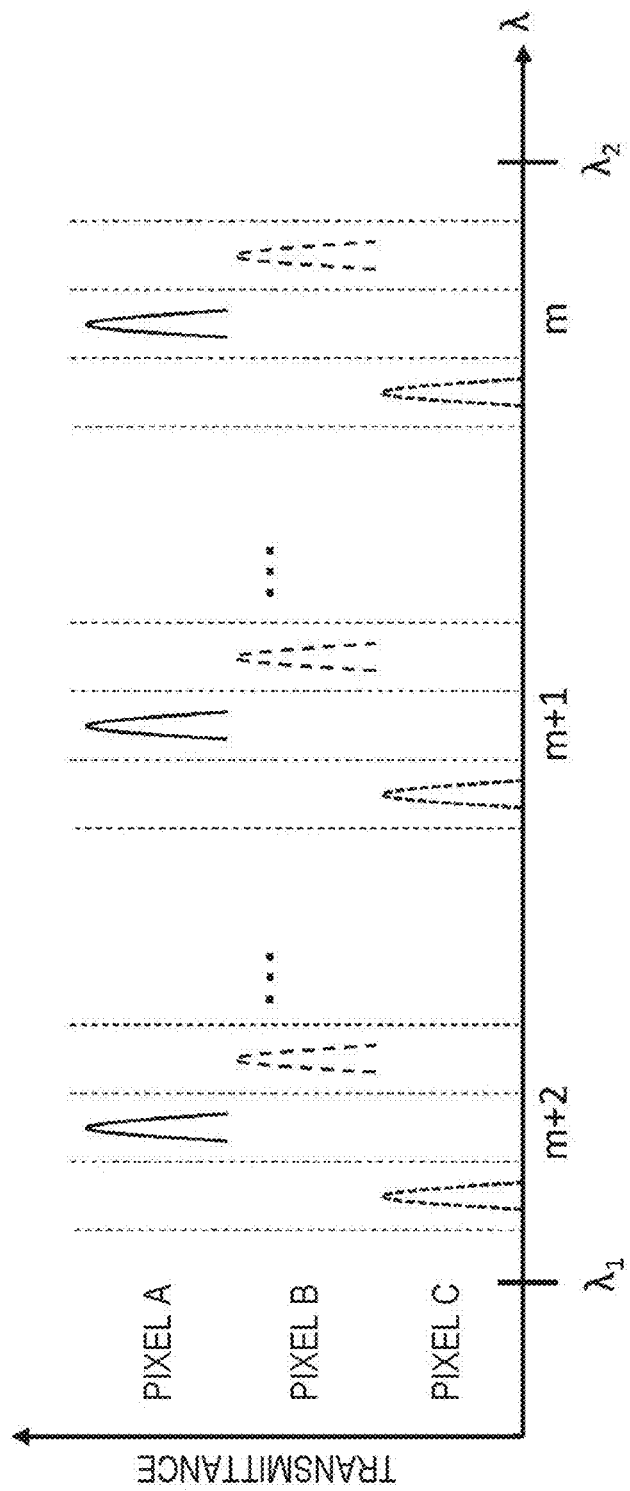
FIG. 6 is a diagram schematically illustrating example transmission spectra at pixels.

FIG. 6 is a diagram schematically illustrating example transmission spectra at respective pixels when multimode filters having different transmission spectra are disposed on the respective pixels. FIG. 6 illustrates some peaks of the transmission spectrum for each of the pixels A, B, and C, and the mode orders m, m+1, and m+2. As illustrated, the multimode filters can be designed such that the peak wavelengths slightly differ depending on the pixel. Such a design can be attained by slightly changing the thickness L and/or the refractive index n in expression (3). The imaging apparatus 100 can simultaneously detect light rays each having different peak wavelengths, at the respective pixels.

Each of the first reflective layer 28a and the second reflective layer 28b can have a structure of, for example, a distributed Bragg reflector (DBR). In this case, each of the first reflective layer 28a and the second reflective layer 28b can be formed of a dielectric multilayer film. Some examples of the structure of the filter 112 in the above-described case will be described below.

Figure 7:
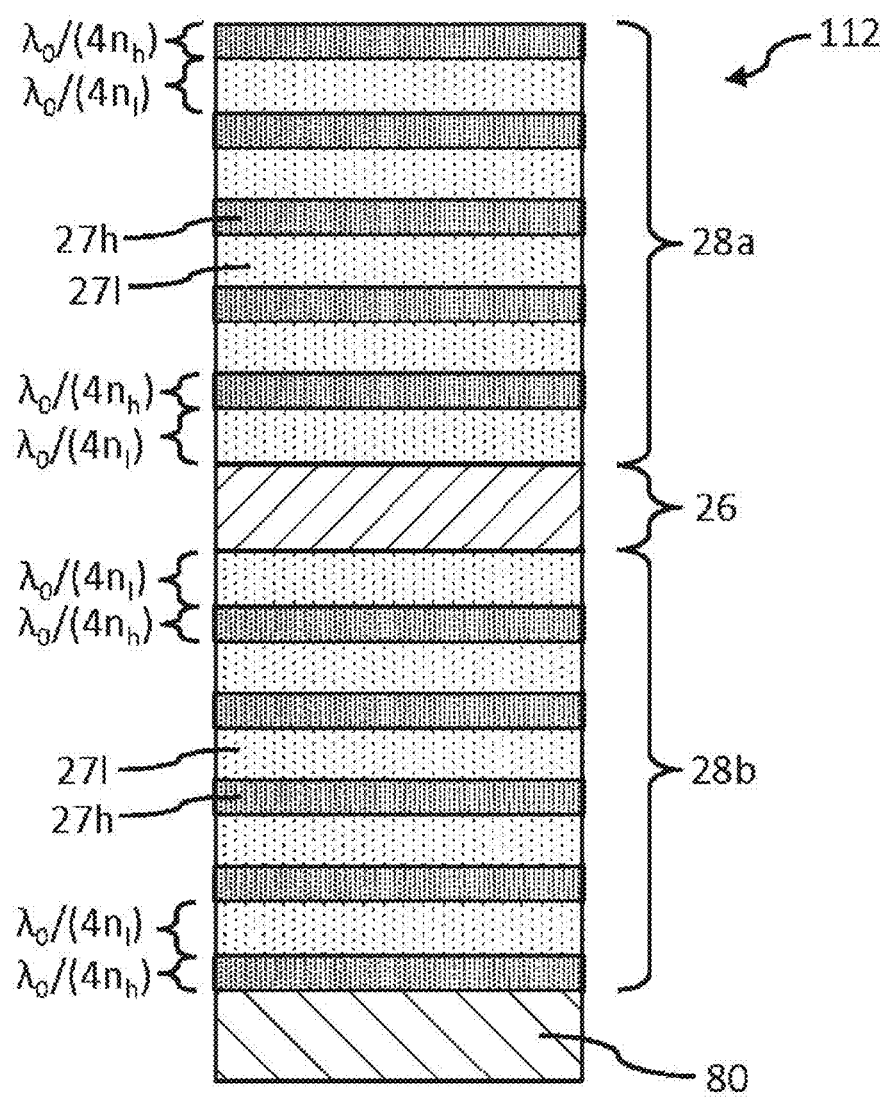
FIG. 7 is a schematic cross-sectional view of an example of the structure of a filter that includes reflective layers each formed of a dielectric multilayer film.

FIG. 7 is a schematic cross-sectional view of an example of the structure of the filter 112 that includes the first reflective layer 28a and the second reflective layer 28b each formed of a dielectric multilayer film. The filter 112 in this example is disposed on a substrate 80. Each of the first reflective layer 28a and the second reflective layer 28b has a structure in which low-refractive-index layers 27l and high-refractive-index layers 27h are alternately stacked. Each of the low-refractive-index layers 27l has a refractive index $n_l$, and each of the high-refractive-index layers 27h has a refractive index $n_h$ higher than the refractive index $n_l$. The low-refractive-index layers 27l in the first reflective layer 28a may have a refractive index the same as or different from the refractive index of the low-refractive-index layers 27l in the second reflective layer 28b. Similarly, the high-refractive-index layers 27h in the first reflective layer 28a may have a refractive index the same as or different from the refractive index of the high-refractive-index layers 27h in the second reflective layer 28b.

Each of the illustrated dielectric multilayer films includes pairs of layers. Each pair of layers includes one low-refractive-index layer 27l and one high-refractive-index layer 27h. In the example illustrated in FIG. 7, each of the first reflective layer 28a and the second reflective layer 28b includes five pairs of layers. To attain a high reflectance for a specific wavelength $\lambda_0$ within the target wavelength range W, the thickness of the high-refractive-index layers 27h can be set to $t_h=\lambda_0/(4n_h)$, and the thickness of the low-refractive-index layers 27l can be set to $t_l=\lambda_0/(4n_l)$. In other words, the optical length of the thickness $t_h$ of the high-refractive-index layers 27h and the optical length of the thickness $t_l$ of the low-refractive-index layers 27l can be set to $\lambda_0/4$. Here, the optical length means a value acquired by multiplexing the thickness by the refractive index.

Figure 8:
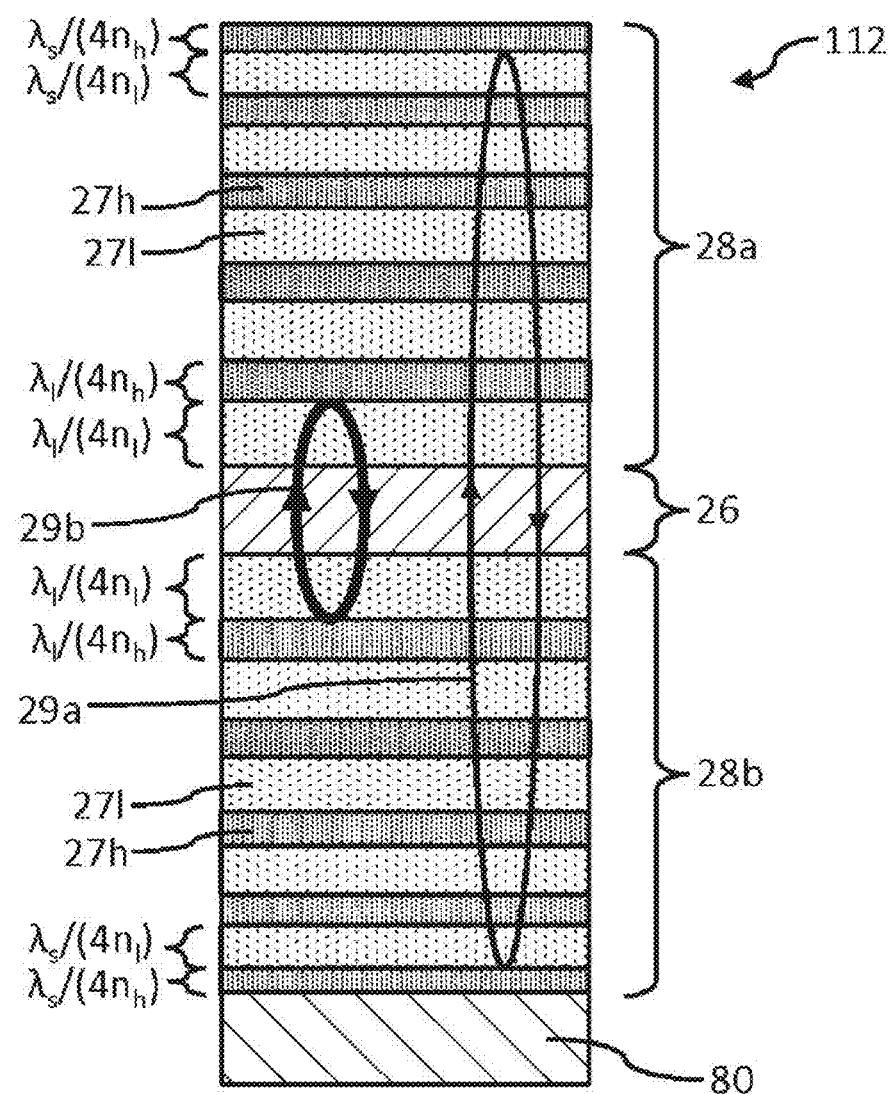
FIG. 8 is a schematic view of another example of the filter that includes reflective layers each formed of a dielectric multilayer film.

FIG. 8 is a schematic view of another example of the filter 112 that includes the first reflective layer 28a and the second reflective layer 28b each formed of a dielectric multilayer film. In the example illustrated in FIG. 8, unlike in the example illustrated in FIG. 7, the thicknesses of the high-refractive-index layers 27h are not uniform and the thicknesses of the low-refractive-index layers 27l are not uniform in each of the first reflective layer 28a and the second reflective layer 28b. In each of the first reflective layer 28a and the second reflective layer 28b, among the low-refractive-index layers 27l, at least two low-refractive-index layers 27l have different thicknesses, and among the high-refractive-index layers 27h, at least two high-refractive-index layers 27h have different thicknesses. In each of the first reflective layer 28a and the second reflective layer 28b, the optical length of each low-refractive-index layer 27l among the low-refractive-index layers 27l is equal to the optical length of the high-refractive-index layer 27h adjacent to and paired with the low-refractive-index layer 27l. Each of the dielectric multilayer films illustrated in FIG. 8 can be designed so as to, for example, reflect light in a wavelength range from a wavelength $\lambda_s$ to a wavelength $\lambda_l$ included in the target wavelength range W. The wavelength $\lambda_s$ may be the same as or different from the lower-limit wavelength $\lambda_1$ of the target wavelength range W. Similarly, the wavelength $\lambda_l$ may be the same as or different from the upper-limit wavelength $\lambda_2$ of the target wavelength range W.

Here, in each of the first reflective layer 28a and the second reflective layer 28b, the pairs of layers are sequentially numbered n=0 to n=4, from the pair farthest from the interference layer 26. The thickness of the high-refractive-index layer 27h can be set to, for example, $t_h(n)=[\lambda_s+n(\lambda_l-\lambda_s)/4]/(4n_h)$. The thickness of the low-refractive-index layer 27l can be set to, for example, $t_l(n)=[\lambda_s+n(\lambda_l-\lambda_s)/4]/(4n_l)$. As described above, in each of the first reflective layer 28a and the second reflective layer 28b, the thickness $t_h(n)$ of the high-refractive-index layer 27h and the thickness $t_l(n)$ of the low-refractive-index layer 27l can be designed so as to attain linear modulation from $\lambda_s/4$ to $\lambda_l/4$. For example, in a case of $\lambda_s=350$ nm and $\lambda_l=700$ nm, the optical length of the thickness of each layer linearly changes from $\lambda_s/4=87.5$ nm to $\lambda_l/4=175$ nm.

In the example illustrated in FIG. 8, a loop 29a represented by a thin line and a loop 29b represented by a thick line schematically illustrate light having the wavelength $\lambda_s$ and light having the wavelength $\lambda_l$ confined within the filter 112, respectively. Light having the wavelength $\lambda_s$ is reflected by the pair of layers adjacent to the surface of incidence of the first reflective layer 28a (that is, the upper side in FIG. 8) and by the pair of layers, in the second reflective layer 28b, adjacent to the substrate 80. In contrast, light having the wavelength $\lambda_l$ is reflected by the pair of layers, in the first reflective layer 28a, adjacent to the interference layer 26 and by the pair of layers, in the second reflective layer 28b, adjacent to the interference layer 26. As described above, incident light is reflected by the pairs of layers corresponding to the wavelength thereof. With such a structure, non-uniformness of the reflectance within the target wavelength range W in the dielectric multilayer films can be reduced.

Each of the high-refractive-index layers 27h and each of the low-refractive-index layers 27l can be formed of, for example, a material having a low absorptance for light within the target wavelength range W. When the target wavelength range W is within the visible-light range, the material can be, for example, at least one selected from the group consisting of $SiO_2$, $Al_2O_3$, $SiO_xN_y$, $Si_3N_4$, $Ta_2O_5$, and $TiO_2$. When the target wavelength range W is within the infrared range, the material can be, for example, at least one selected from the group consisting of monocrystalline Si, polycrystalline Si, and amorphous Si in addition to $SiO_2$, $Al_2O_3$, $SiO_xN_y$, $Si_3N_4$, $Ta_2O_5$, and $TiO_2$ described above.

The interference layer 26 can be formed of any of the materials described above. However, the interference layer 26 has a refractive index different from that of the low-refractive-index layer 27l or the high-refractive-index layer 27h that is in contact with the interference layer 26. The interference layer 26 is not limited to a single layer and may include stacked layers. The layers can be formed of different materials. The refractive indexes of the layers may be different to some extent so as not to substantially affect the transmission spectrum of the filter. On the interface between layers having different refractive indexes, reflection can occur. However, as long as the reflection dost not substantially affect the transmission spectrum, each of the layers can be considered as part of the interference layer 26 that is substantially uniform. The interference layer 26 may be a gaseous layer of, for example, air.

The structures illustrated in FIG. 7 and FIG. 8 are only examples, and the structure of each filter 112 in the filter array 110 is designed as appropriate in accordance with necessary performance. For example, the number of pairs of layers in each of the reflective layers is not limited to five and is determined in accordance with necessary performance. Although the thickness of a layer farther from the interference layer 26 is decreased in the example illustrated in FIG. 8, a structure may be employed in which the thickness of a layer farther from the interference layer 26 is increased. The thickness of a layer farther from the interference layer 26 need not be monotonously increased or decreased.

Although the first reflective layer 28a and the second reflective layer 28b are disposed on both sides of the interference layer 26 in the examples illustrated in FIG. 7 and FIG. 8, a reflective layer may be disposed only on one side of the interference layer 26. In this case, one of the surfaces of the interference layer 26 may be exposed to an external medium, such as air. Even with such a configuration, reflection occurs on the interface between the interference layer 26 and the external medium, and therefore, resonance can be made to occur within the interference layer 26. With the configuration in which a reflective layer is disposed only on one side of the interference layer 26, loss of the amount of light can be reduced.

Structure Including Band-Limiting Filters

As described above, in the imaging system that generates hyperspectral images by using, for example, a compressed-sensing method, the filter array 110 that includes filters having different spectral transmittances is used. As the wavelength distribution and spatial distribution of the optical transmittances of the filters, for example, a distribution having high randomness, such as a random distribution or a quasi-random distribution described above, can be selected. When the matrix H determined on the basis of the spatial distribution of the spectral transmittances is used, hyperspectral images can be estimated. When the randomness of the wavelength distribution and spatial distribution of the optical transmittances of the filters is increased, more accurate hyperspectral images can be generated.

The filter array 110 can be implemented by using interference filters that change the reflectance of light from wavelength to wavelength by using an interference phenomenon of light as described above. As the interference filters, for example, filters having a structure of a Fabry-Perot resonator as described above can be used. In addition, for example, filters having a structure including a diffraction grating as disclosed in Japanese Unexamined Patent Application Publication No. 2008-070427 or a structure using surface plasmon resonance as disclosed in Japanese Unexamined Patent Application Publication No. 2010-008990 can be used.

When the filter array 110 is constituted by interference filters, as the target wavelength range, that is, the operating wavelength range of the imaging system, becomes broader, an error in reconstructed hyperspectral images increases. This is caused by a low-order mode in a longer-wavelength range in the target wavelength range and a high-order mode in a shorter-wavelength range therein occurring in the same structure and interfering with each other. When a low-order mode in a longer-wavelength range and a high-order mode in a shorter-wavelength range occur in the same structure and interfere with each other in the interference filter, randomness concerning the space and wavelength of the optical transmittance of the filter array 110 decreases. As a result, the randomness of the values of the matrix H used in a reconstruction operation decreases, and an error in reconstructed hyperspectral images increases. The above-described issue will be described in detail below with reference to an example of a filter having a structure of a Fabry-Perot resonator.

A Fabry-Perot resonator has a structure in which an interference layer that makes interference of light occur is sandwiched between reflective layers that reflect a certain proportion of light in the target wavelength range. A Fabry-Perot resonator has a property of preferentially transmitting light having a wavelength corresponding to the thickness of the interference layer. Each of the reflective layers can be formed of, for example, a dielectric multilayer film that functions as a distributed Bragg reflector (DBR). In this case, the wavelength of reflected light is determined on the basis of the refractive index and thickness of each layer in the DBR. When the thickness of one layer in the DBR is denoted by t and the refractive index of the layer is denoted by n, the reflectance of light having a wavelength $\lambda i$ satisfying $\lambda i/4 = n \times t$ is highest in the layer. In contrast, each layer in the DBR may also function as an interference layer. The condition that a mode of light occurs in a layer in the DBR depends on the thickness t and the refractive index n of the layer. When the condition of $\lambda j/2 \leq n \times t$ is satisfied, the layer functions as an interference layer and a mode of light having a wavelength $\lambda j$ is formed inside the layer.

Here, as illustrated in FIG. 3A and FIG. 3B, the wavelength at the shorter-wavelength end of the target wavelength range W is denoted by $\lambda_1$ and the wavelength at the longer-wavelength end of the target wavelength range W is denoted by $\lambda_2$. When $\lambda_2$ is greater than a wavelength twice as much as $\lambda_1$, that is, $\lambda_2 > 2\lambda_1$ is satisfied, a mode of light having a wavelength $\lambda_k$ that satisfies $\lambda_1 \leq \lambda_k \leq \lambda_2/2$ occurs inside a layer having an optical length $\lambda_2/4$ that reflects light having the longest wavelength $\lambda_2$. The occurrence of a mode of light in the DBR means that a low-order mode in a longer-wavelength range in the operating wavelength range and a high-order mode in a shorter-wavelength range in the operating wavelength range occur in the same structure and interfere with each other. In this case, the acquired transmission spectrum includes wavelengths at which the randomness of the transmittance is low in the shorter-wavelength range in the target wavelength range W.

FIG. 9A is a diagram illustrating example transmission spectra of eight types of filters included in the filter array 110. FIG. 9B is an enlarged diagram of the transmission spectra in a wavelength range from 400 nm to 600 nm in FIG. 9A. In this example, the target wavelength range W, that is, the operating wavelength range, is set to a relatively broad range from 400 nm to 1600 nm. Each of the filters has a structure of a Fabry-Perot resonator that includes DBRs described above as reflective layers. The illustrated transmission spectra were acquired by adjusting the structure of the interference layer and the DBRs for each of the filters. When the target wavelength range W is broad as in this example, a mode of light occurs even within the DBR of each of the filters, and the difference between the transmittances of the filters decreases in a shorter-wavelength range in the target wavelength range W. As a result, the randomness of the transmittance significantly decreases specifically in the shorter-wavelength range. For example, at a wavelength indicated by the arrow in FIG. 9B, all the eight types of filters have substantially the same transmittances. A decrease in the randomness of the transmittance of the filter array 110 as described above directly results in an increase in an estimation error in hyperspectral images.

Figure 10:
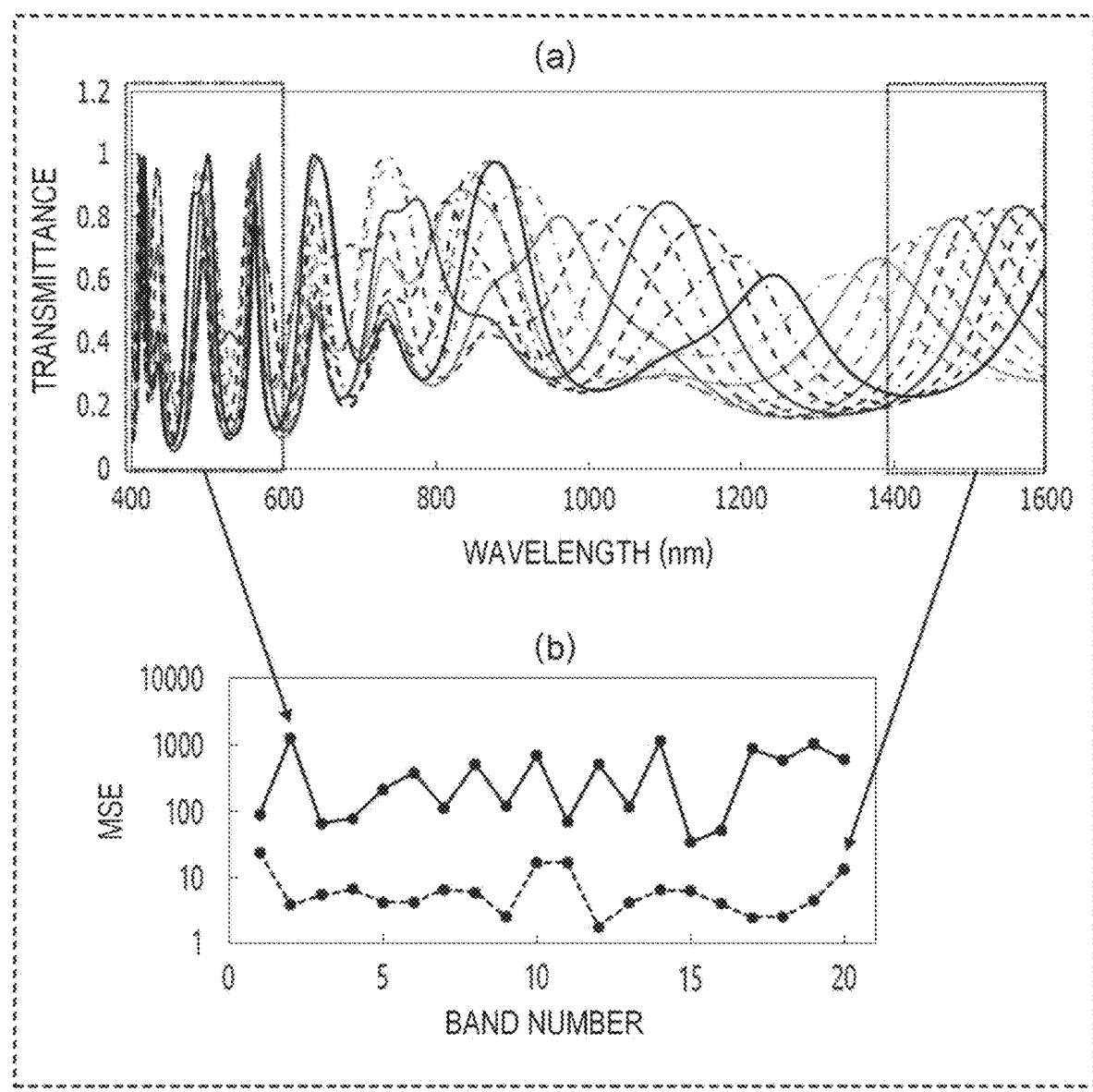
FIG. 10 includes diagrams illustrating example errors in an estimation operation of hyperspectral images.

FIG. 10 includes diagrams illustrating example errors in an estimation operation of hyperspectral images performed by using a filter array that includes filters having the transmission spectra illustrated in FIG. 9A. The spectra illustrated in FIG. 10(*a*) are the same as the spectra illustrated in FIG. 9A. FIG. 10(*b*) illustrates example estimation errors in 40 wavelength bands in total acquired by dividing each of the wavelength range from 400 nm to 600 nm and the wavelength range from 1400 nm to 1600 nm in FIG. 10(*a*) into 20 equal wavelength bands. Here, for each of the wavelength range from 400 nm to 600 nm and the wavelength range from 1400 nm to 1600 nm, the wavelength bands are numbered 1 to 20 from the shortest wavelength band. The estimation error in each wavelength band is evaluated on the basis of the mean squared error (MSE) between the estimated image and a ground truth image. The MSE is a value acquired by dividing the sum total of the squares of errors for the respective pixels between the estimated image and the ground truth image by the number of pixels. The result of calculation of the MSE is affected by the number of bits of the acquired image and that of the reconstructed image. In this embodiment, the acquired image is based on 8 bits, that is, 256 grayscale levels, and the estimated image is also generated on the basis of 8 bits. As illustrated in FIG. 10, it was confirmed that an estimation error in a hyperspectral image increased in the shorter-wavelength range having low randomness. In contrast, it was confirmed that a hyperspectral image could be estimated with a small error in the longer-wavelength range having high randomness. When a hyperspectral image is expressed with 256 grayscale levels, an estimation error in the hyperspectral image is expressed as follows.

$$\text{Estimation error (\%)} = \frac{\sqrt{MSE}}{256} \times 100$$

When, for example, the MSE is equal to 100, $\sqrt{100}=10$ holds, and therefore, the estimation error in the hyperspectral image is equal to about 4% on the basis of the expression above. It was confirmed that although the error was approximately from 1% to 2% in the longer-wavelength range, an error greater than 10% occurred in the shorter-wavelength range. From the expression above, an estimation error of 2% corresponds to an MSE of about 26, and an estimation error of 10% corresponds to an MSE of about 655.

As described above, when the operating wavelength range is broad, an estimation error in a hyperspectral image tends to increase specifically in the shorter-wavelength range. This issue can similarly arise in a case of using a multimode filter having a structure different from a structure of a Fabry-Perot resonator that includes DBRs as reflective layers. The above-described issue can similarly arise, for example, in a case of using another type of multimode filter using interference of light, such as a filter including a diffraction grating or a filter using a surface plasmon effect. That is, in a multimode filter, when $\lambda_2 > 2\lambda_1$ is satisfied, the randomness of the transmittance decreases in the shorter-wavelength range in the target wavelength range W and an estimation error in a hyperspectral image increases.

The present inventors have found the above-described issues and considered a new structure of a filter array for addressing the issues. As a result, the present inventors have found that the above-described issues could be addressed by employing a filter configuration in which a band-limiting filter that restricts transmission of light in a specific wavelength range is superimposed in addition to a multimode filter. With such a filter configuration, the randomness of the transmittance can be kept high throughout a broad wavelength range and the operating wavelength range can be increased. An example configuration of such a filter array will be specifically described below.

Figure 11:
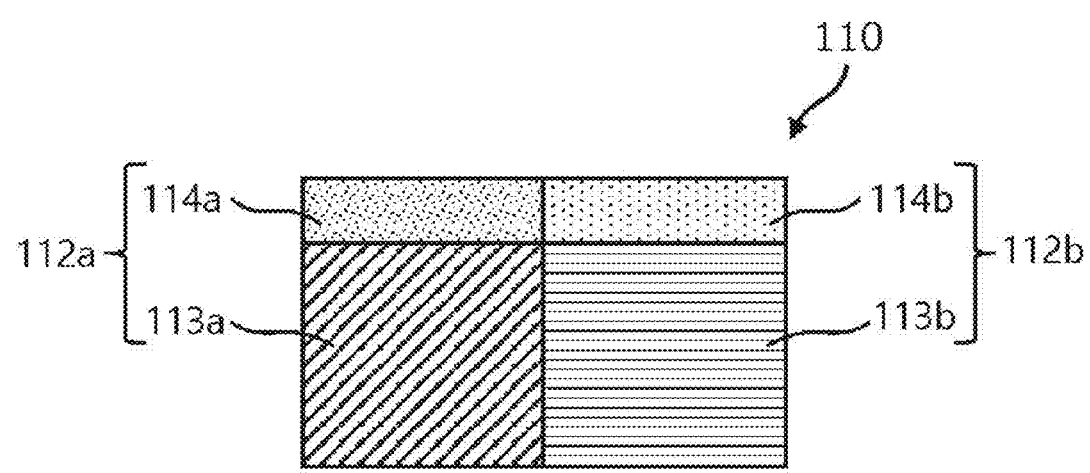
FIG. 11 is a diagram illustrating a schematic configuration of the filter array.

FIG. 11 is a diagram schematically illustrating a part of the configuration of the filter array 110 in an embodiment. The filter array 110 includes optical filters that are arranged in two dimensions and that have different transmission spectra. FIG. 11 schematically illustrates a cross section of two adjacent filters among the filters 112. These two filters are hereinafter referred to as a first filter 112a and a second filter 112b.

The first filter 112a includes a first multimode filter 113a and a first band-limiting filter 114a. The first multimode filter 113a has, within the target wavelength range W, first peak wavelengths at each of which the optical transmittance is at a local maximum. The first band-limiting filter 114a is disposed so as to overlap the first multimode filter 113a. Here, two filters that overlap each other means that the filters have a positional relationship such that the filters at least partially overlap when viewed in the normal direction of the filters. Between the two filters, another member may be interposed. The limiting band of the first band-limiting filter 114a is a first sub-wavelength range that is a part of the target wavelength range W.

In the example illustrated in FIG. 11, the first multimode filter 113a is disposed on the optical path of transmitted light that has passed through the first band-limiting filter 114a. In contrast, the first band-limiting filter 114a may be disposed on the optical path of transmitted light that has passed through the first multimode filter 113a.

The second filter 112b includes a second multimode filter 113b and a second band-limiting filter 114b. The second multimode filter 113b has, within the target wavelength range W, second peak wavelengths at each of which the optical transmittance is at a local maximum. Here, the combination of the second peak wavelengths is different from the combination of the first peak wavelengths described above. That is, at least one of the second peak wavelengths is different from the first peak wavelengths. The second band-limiting filter 114b is disposed so as to overlap the second multimode filter 113b. The second band-limiting filter 114b restricts transmission of light in a second sub-wavelength range that is a part of the target wavelength range W. The second sub-wavelength range is different from the first sub-wavelength range. Note that the second sub-wavelength range and the first sub-wavelength range may partially overlap each other.

In the example illustrated in FIG. 11, the second multimode filter 113b is disposed on the optical path of transmitted light that has passed through the second band-limiting filter 114b. In contrast, the second band-limiting filter 114b may be disposed on the optical path of transmitted light that has passed through the second multimode filter 113b.

Figure 12A:
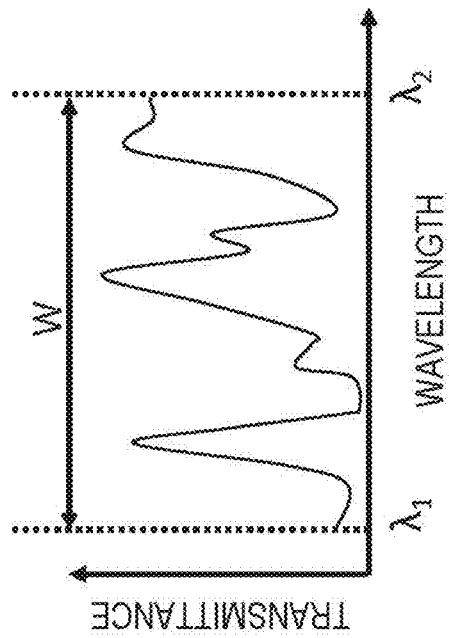
FIG. 12A and FIG. 12B are diagrams respectively illustrating an example transmission spectrum of a first multimode filter and that of a second multimode filter.
Figure 12B:
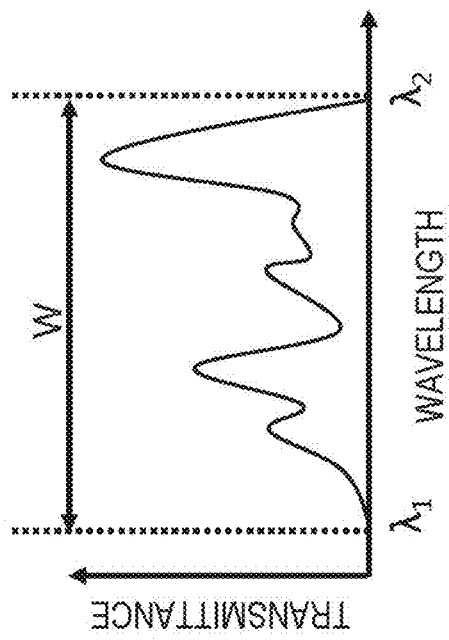

FIG. 12A and FIG. 12B are diagrams respectively illustrating an example transmission spectrum of the first multimode filter 113a and that of the second multimode filter 113b. FIG. 12A illustrates an example transmission spectrum of the first multimode filter 113a. FIG. 12B illustrates an example transmission spectrum of the second multimode filter 113b. As illustrated in FIG. 12A and FIG. 12B, each of the first multimode filter 113a and the second multimode filter 113b has, in wavelength bands included in the target wavelength range W, peak wavelengths at each of which the transmittance is at a local maximum. Although some of the peak wavelengths of the first multimode filter 113a may overlap peak wavelengths of the second multimode filter 113b, the peak wavelengths of the first multimode filter 113a do not completely match with the peak wavelengths of the second multimode filter 113b.

Each of the first multimode filter 113a and the second multimode filter 113b can be, for example, an interference filter having a structure of a Fabry-Perot resonator described above. When the structure of the interference layer and reflective layers are appropriately designed, a transmission spectrum having peak wavelengths within the target wavelength range W can be attained.

In this embodiment, in addition to the first multimode filter 113a and the second multimode filter 113b, the first band-limiting filter 114a and the second band-limiting filter 114b are provided. The first band-limiting filter 114a and the second band-limiting filter 114b restrict transmission of light in a wavelength range that is a part of the target wavelength range W. Here, "restricting transmission of light" in a wavelength range does not mean that transmission of light in the wavelength range is completely restricted. In the specification, "restricting transmission of light" in a wavelength range means that a restriction is imposed such that the transmittance of light in the wavelength range is at least less than or equal to 80%. In the specification, a band of each filter in which the transmittance of light is less than or equal to 80% is referred to as "limiting band".

Figure 13B:
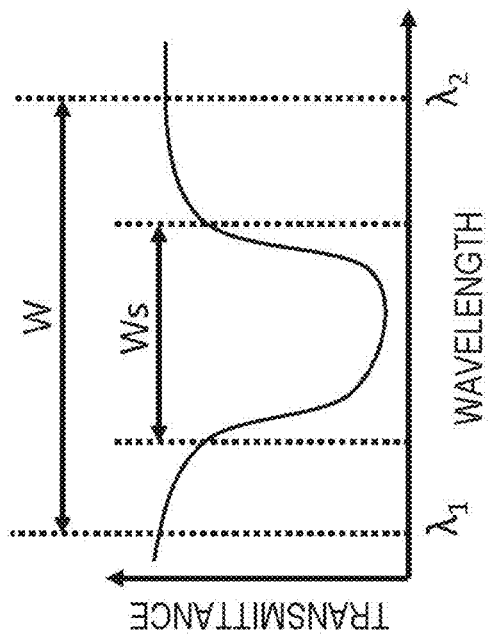
FIG. 13A and FIG. 13B are diagrams respectively illustrating an example transmission spectrum of a first band-limiting filter and that of a second band-limiting filter.
Figure 13A:
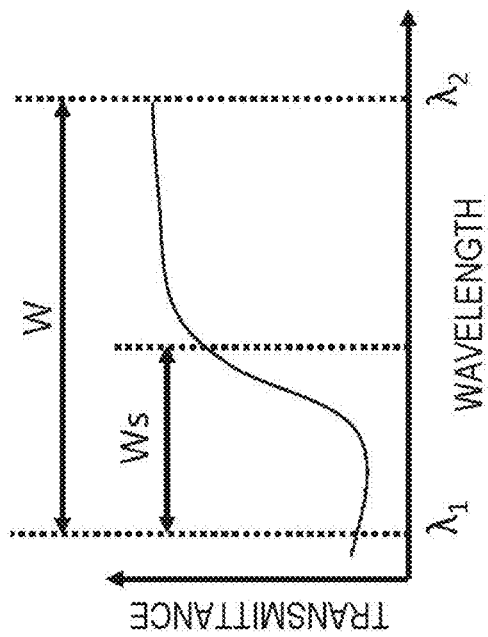

FIG. 13A and FIG. 13B are diagrams respectively illustrating an example transmission spectrum of the first band-limiting filter 114a and that of the second band-limiting filter 114b. FIG. 13A illustrates an example transmission spectrum of the first band-limiting filter 114a. FIG. 13B illustrates an example transmission spectrum of the second band-limiting filter 114b. Each of the first band-limiting filter 114a and the second band-limiting filter 114b has, within the target wavelength range W, a limiting band Ws in which the transmittance is relatively low and a pass-band in which the transmittance is relatively high. In the target wavelength range W, a wavelength range other than the limiting band Ws is a pass-band.

Although FIG. 11 illustrates only the first filter 112a and the second filter 112b, the filter array 110 can include another filter having a similar structure. For example, the optical filters in the filter array 110 may further include a third filter in addition to the first filter 112a and the second filter 112b described above. The third filter can include a third multimode filter and a third band-limiting filter. The third multimode filter has, within the target wavelength range, third peak wavelengths at each of which the optical transmittance is at a local maximum. Here, the combination of the third peak wavelengths can be designed so as to be different from both the combination of the first peak wavelengths and the combination of the second peak wavelengths described above. That is, at least one of the third peak wavelengths is different from the first peak wavelengths, and at least one of the third peak wavelengths is different from the second peak wavelengths. For example, the third peak wavelengths may include peak wavelengths $\lambda 1$ and $\lambda 2$, the peak wavelength $\lambda 1$ may be different from the first peak wavelengths, and the peak wavelength $\lambda 2$ may be different from the second peak wavelengths. The third band-limiting filter can be disposed so as to overlap the third multimode filter. The limiting band of the third band-limiting filter is a third sub-wavelength range that is a part of the target wavelength range. The third sub-wavelength range can be designed so as to be different from both the first sub-wavelength range and the second sub-wavelength range. The third sub-wavelength range and the first sub-wavelength range may partially overlap each other. Similarly, the third sub-wavelength range and the second sub-wavelength range may partially overlap each other.

As described above, the filter array 110 may include three or more types of band-limiting filters having different limiting bands. Band-limiting filters having equivalent characteristics may be disposed on multimode filters having different transmission spectra so as to overlap the multimode filters, respectively. All the filters in the filter array 110 may have a layered structure that includes a multimode filter and a band-limiting filter or only some of the filters may have such a layered structure. The filter array 110 may include a filter in which a band-limiting filter is not provided, that is, a filter that includes only a multimode filter. For example, the filters in the filter array 110 may further include a fourth filter having a structure different from those of the first to third filters described above. The fourth filter has, within the target wavelength range, fourth peak wavelengths at each of which the optical transmittance is at a local maximum. The combination of the fourth peak wavelengths can be designed so as to be different from all of the combination of the first peak wavelengths, the combination of the second peak wavelengths, and the combination of the third peak wavelengths. That is, at least one of the fourth peak wavelengths is different from the first peak wavelengths, at least one of the fourth peak wavelengths is different from the second peak wavelengths, and at least one of the fourth peak wavelengths is different from the third peak wavelengths. For example, the fourth peak wavelengths may include peak wavelengths $\lambda 1$, $\lambda 2$, and $\lambda 3$, the peak wavelength $\lambda 1$ may be different from the first peak wavelengths, the peak wavelength $\lambda 2$ may be different from the second peak wavelengths, and the peak wavelength $\lambda 3$ may be different from the third peak wavelengths. When filters not including a band-limiting filter and filters including a band-limiting filter are mixed together, the entire transmission spectrum of the filter array 110 can be further varied.

In the following description, the individual multimode filters might not be distinguished from each other and may be referred to as "multimode filters 113". Similarly, the individual band-limiting filters might not be distinguished from each other and may be referred to as "band-limiting filters 114".

Each of the band-limiting filters 114 can have, for example, a very small structure that includes at least one of a dielectric multilayer film, an organic material, a diffraction grating structure, or metal. The material of the multimode filters 113 and the material of the band-limiting filters 114 may be the same or may be different. Each of the band-limiting filters 114 can be, for example, a color filter that selectively transmits light in a specific color. Alternatively, each of the band-limiting filters 114 may be a filter that is formed of a dielectric multilayer film, such as a DBR, and selectively transmits light in a specific wavelength range.

In the example illustrated in FIG. 11, each of the multimode filters 113 and a corresponding one of the band-limiting filters 114 are stacked without another member interposed therebetween. Such a structure need not be employed, and another layer or member may be interposed between the multimode filter 113 and the band-limiting filter 114. For example, an optical member that makes light be reflected or refracted may be disposed between the multimode filter 113 and the band-limiting filter 114. In this case, the multimode filter 113 and the band-limiting filter 114 can be disposed so as not to overlap each other.

Figure 14:
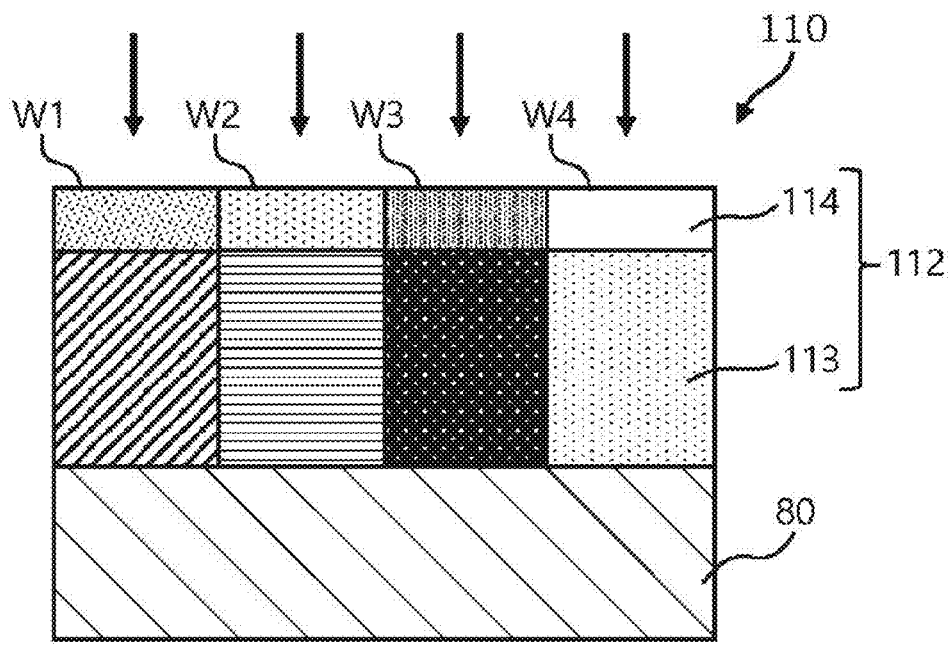
FIG. 14 is a schematic cross-sectional view of another example of the filter array.

FIG. 14 is a schematic cross-sectional view of another example of the filter array 110. The filter array 110 includes the substrate 80, the multimode filters 113 stacked on the substrate 80, and the band-limiting filters 114. The filter array 110 includes four types of multimode filters 113 having different combinations of peak wavelengths and four types of band-limiting filters 114 having different limiting bands. In this example, incident light rays are incident from the upper side of FIG. 14, pass through both the band-limiting filters 114 and the multimode filters 113, further pass through the substrate 80, and are received by photodetection elements, of the image sensor, that are on optical axes the same as the optical axes of the corresponding band-limiting filters 114 and multimode filters 113, respectively.

Figure 15:
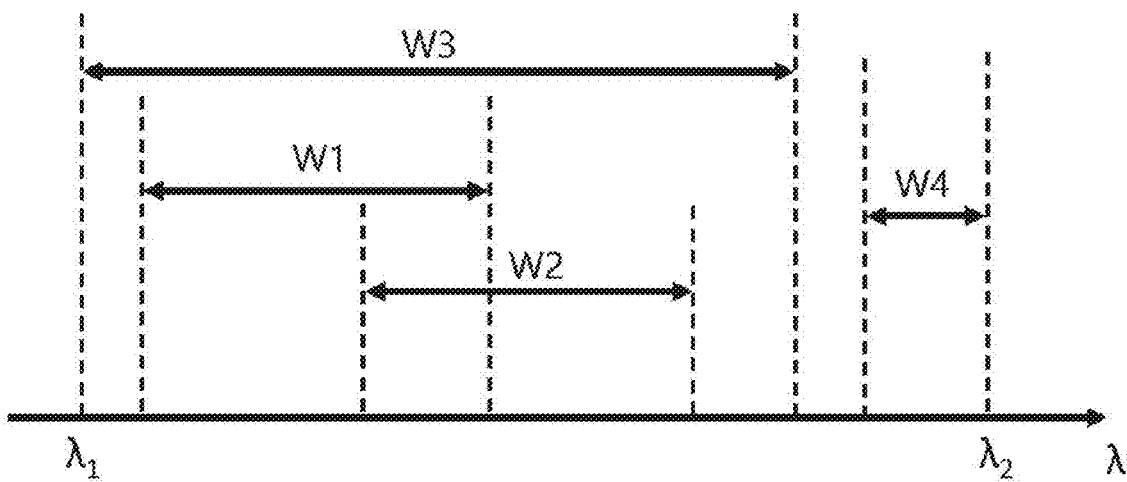
FIG. 15 is a diagram illustrating example limiting bands of four types of band-limiting filters.

FIG. 15 is a diagram illustrating example limiting bands W1, W2, W3, and W4 of the respective four types of band-limiting filters 114. As illustrated in FIG. 15, the limiting band and the pass-band can differ depending on the band-limiting filter 114. The limiting bands of the band-limiting filters 114 may be spaced apart from each other or overlap each other. Although each of the band-limiting filters 114 has one limiting band within the target wavelength range in this example, each of the band-limiting filters 114 may have plural limiting bands.

Figure 16A:
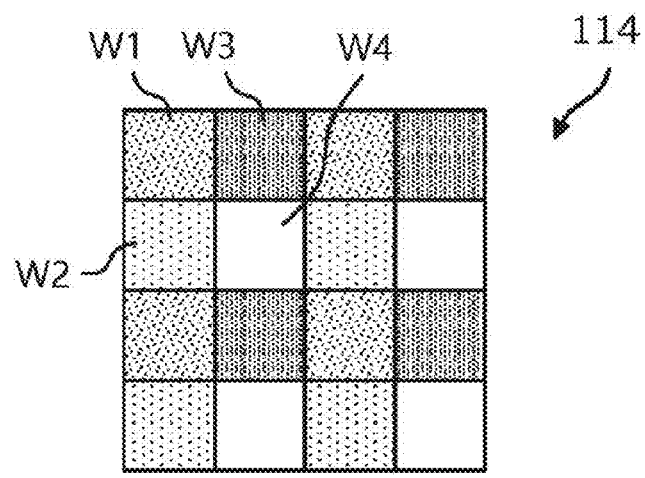
FIG. 16A is a diagram illustrating an example disposition of the band-limiting filters.
Figure 16B:
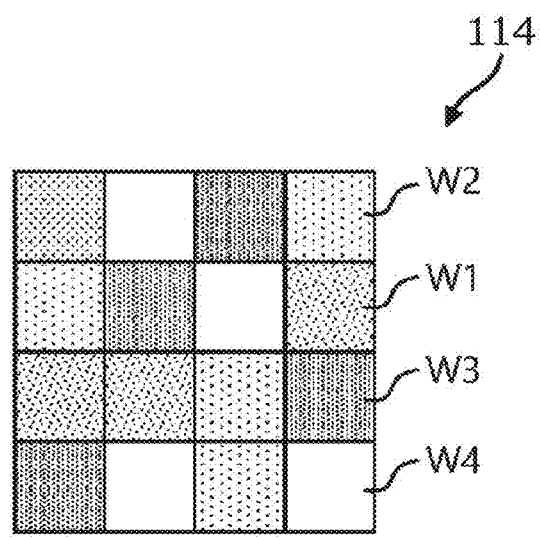
FIG. 16B is a diagram illustrating another example disposition of the band-limiting filters.

FIG. 16A and FIG. 16B are diagrams illustrating examples of the disposition of the band-limiting filters 114. FIG. 16A illustrates an example where the four types of band-limiting filters 114 are regularly disposed in two dimensions. In contrast, FIG. 16B illustrates an example where the four types of band-limiting filters 114 are randomly disposed in two dimensions. As described above, the plural types of band-limiting filters 114 having different limiting bands can be arranged in any form as desired.

In the examples illustrated in FIG. 11 and FIG. 14, each of the band-limiting filters 114 entirely covers a corresponding one of the multimode filters 113. Such a structure need not be employed, and each of the band-limiting filters 114 covers only a part of a corresponding one of the multimode filters 113. The band-limiting filters 114 may have dimensions the same as or different from those of the multimode filters 113 in a direction perpendicular to the optical path of incident light. In an example, a set of the multimode filter 113 and the band-limiting filter 114 can be disposed such that light that has passed through the filters is incident only on a corresponding one of the photodetection elements in the image sensor. In another example, each set of the multimode filter 113 and the band-limiting filter 114 can be disposed such that light that has passed through the filters is incident on corresponding ones of the photodetection elements in the image sensor.

Figure 17:
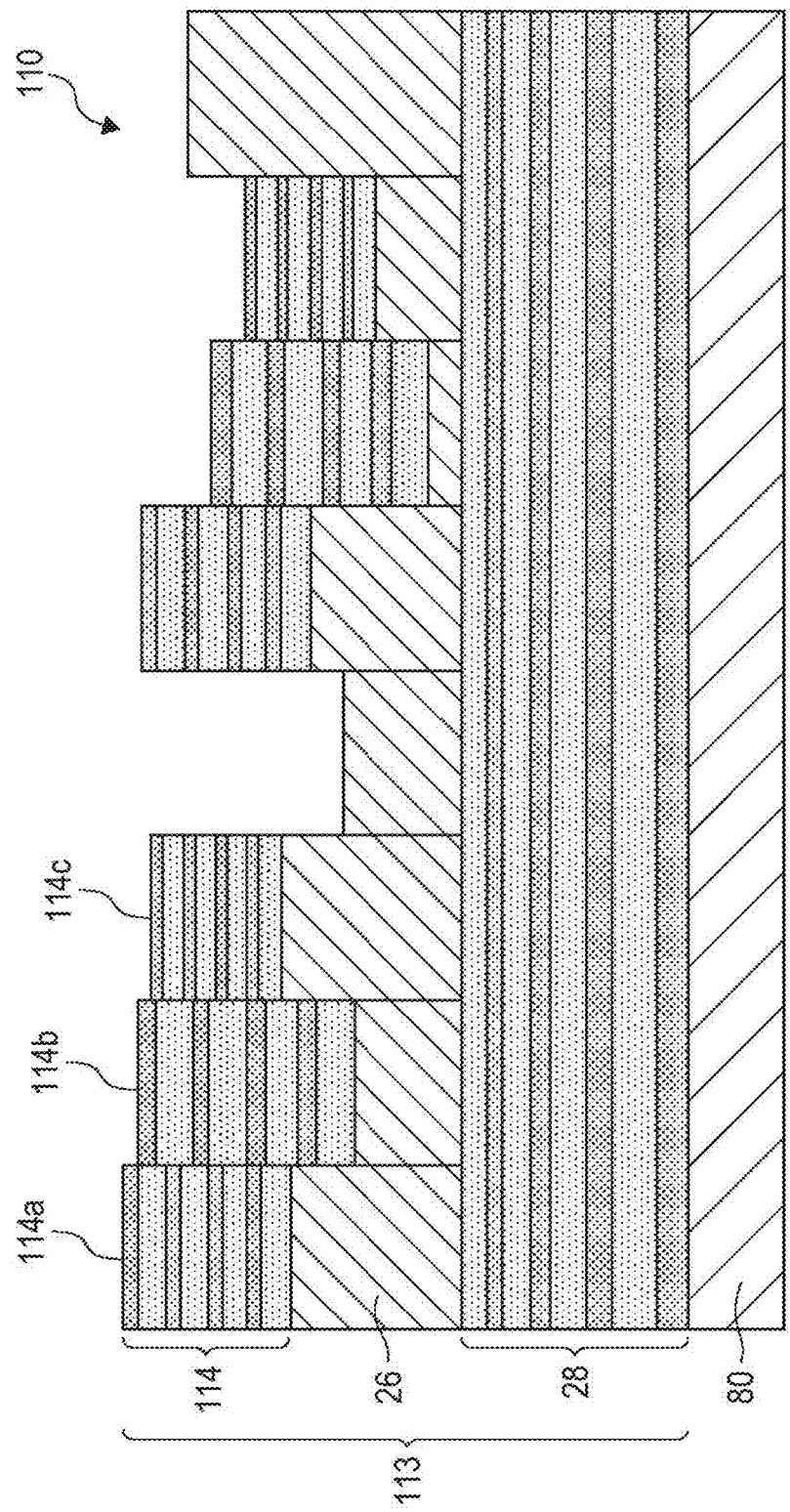
FIG. 17 is a cross-sectional view of an example of the specific structure of the filter array.

FIG. 17 is a cross-sectional view of an example of the specific structure of the filter array 110. FIG. 17 illustrates a part of the cross-sectional structure of one row or one column in the filter array 110. In this example, an array of the multimode filters 113 and an array of the band-limiting filters 114 are stacked on the substrate 80. The multimode filters 113 each include a reflective layer 28 having a structure of a DBR and the interference layer 26. In this example, each of the band-limiting filter 114 has a structure of a DBR as in the reflective layer 28. On the substrate 80, the reflective layers 28, the interference layers 26, and the band-limiting filters 114 are stacked in this order. The multimode filters 113 and the band-limiting filters 114 may be stacked in an order that is the reverse of the illustrated order. That is, the band-limiting filters 114 may be disposed on the substrate 80, and the multimode filters 113 may be disposed on the band-limiting filters 114. The order in which the multimode filter 113 and the band-limiting filter 114 are stacked may differ depending on the filter. Although the size of the multimode filters 113 are the same as that of the band-limiting filters 114 in a direction perpendicular to the optical path of incident light in the example illustrated in FIG. 17, the size of the multimode filters 113 may be different from that of the band-limiting filters 114.

In the example illustrated in FIG. 17, the thickness of the interference layer 26 differs depending on the filter. Accordingly, a structure in which the combination of peak wavelengths differs depending on the filter is implemented. The array of the band-limiting filters 114 includes three types of band-limiting filters 114 having different limiting bands and a part in which the band-limiting filter 114 is not disposed. That is, the filter array 110 includes three types of filters respectively including the three types of band-limiting filters 114 having different limiting bands and one type of filter not including the band-limiting filter 114. These four types of filters can be arranged in two dimensions, for example, in a form similar to that of the four types of filters indicated as W1 to W4 in FIG. 16A or FIG. 16B.

In this example, each of the multimode filters 113 includes a DBR, that is, the reflective layer 28, only on one side unlike the Fabry-Perot filter illustrated in FIG. 7 and FIG. 8. Of the two surfaces of the interference layer 26, a surface on which the reflective layer 28 is not disposed is in contact with the band-limiting filter 114 or air. Even with such a structure, the multimode filters 113 function as Fabry-Perot filters, and a satisfactory transmission spectrum can be attained.

Figure 18A:
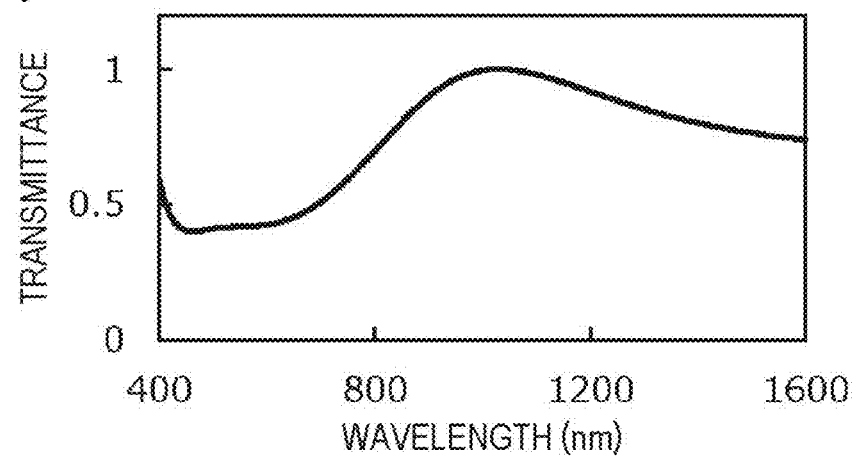
FIG. 18A is a diagram illustrating an example transmission spectrum of a band-limiting filter.
Figure 18B:
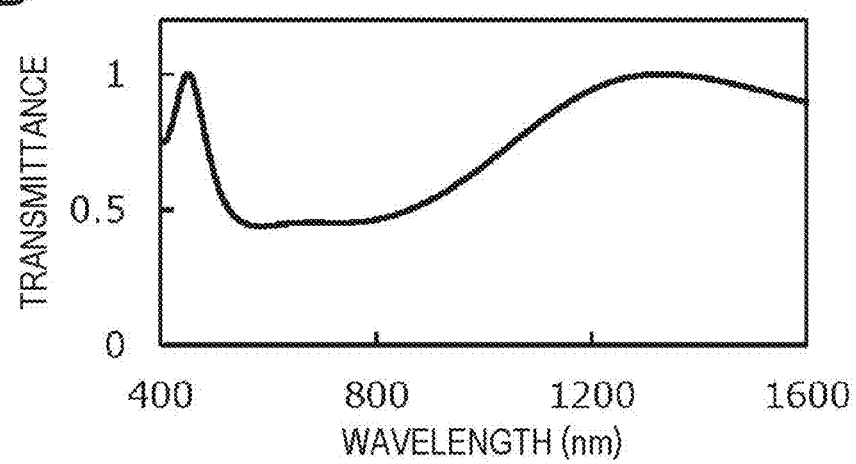
FIG. 18B is a diagram illustrating an example transmission spectrum of another band-limiting filter.
Figure 18C:
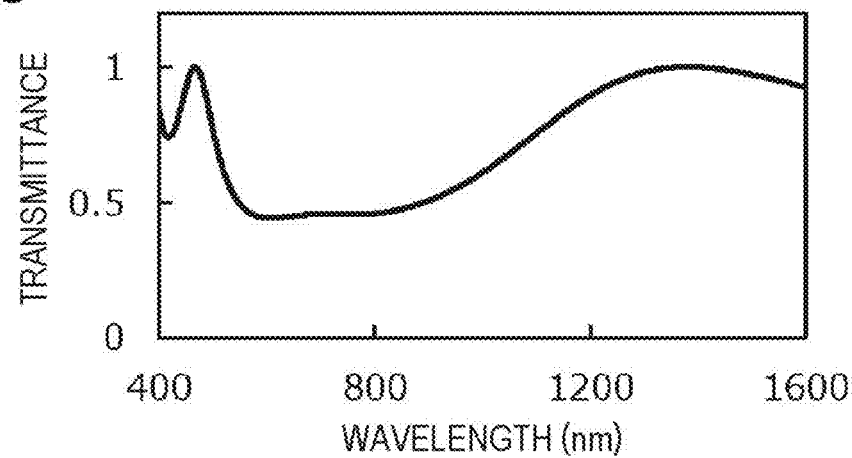
FIG. 18C is a diagram illustrating an example transmission spectrum of another band-limiting filter.

FIG. 18A, FIG. 18B, and FIG. 18C are diagrams respectively illustrating an example transmission spectrum of the first band-limiting filter 114a, that of the second band-limiting filter 114b, and that of a third band-limiting filter 114c illustrated in FIG. 17. The transmission spectrum illustrated in FIG. 18A has a local minimum of the transmittance at about 500 nm. The transmission spectrum illustrated in FIG. 18B has a local minimum of the transmittance at about 650 nm. The transmission spectrum illustrated in FIG. 18C has the lowest local minimum at about 675 nm. In this example, all of the first band-limiting filter 114a, the second band-limiting filter 114b, and the third band-limiting filter 114c intensively impose a restriction on a band of relatively shorter wavelengths. When such three types of band-limiting filters are provided, the randomness of the transmittance specifically in the shorter wavelength range can be increased, and an estimation error in hyperspectral images can be reduced.

With reference to FIG. 19A to 19D, effects attained by providing the band-limiting filters 114 will be described below.

Figure 19A:
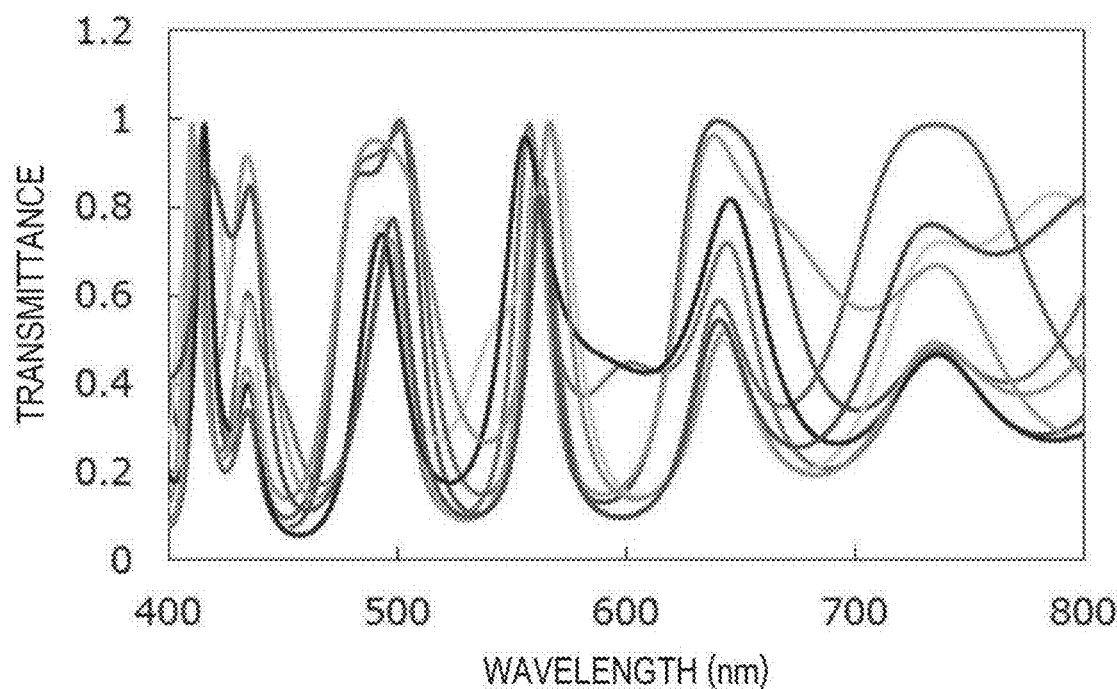
FIG. 19A is a diagram illustrating example transmission spectra of the filter array that does not include band-limiting filters.

FIG. 19A is a diagram illustrating example transmission spectra of a filter array that does not include the band-limiting filters 114. In this filter array, eight types of multimode filters 113 having different transmission spectra are arranged in two dimensions, and the band-limiting filters 114 are not provided. FIG. 19A is an enlarged diagram of the spectra in a range from 400 nm to 800 nm in FIG. 9A.

Figure 19B:
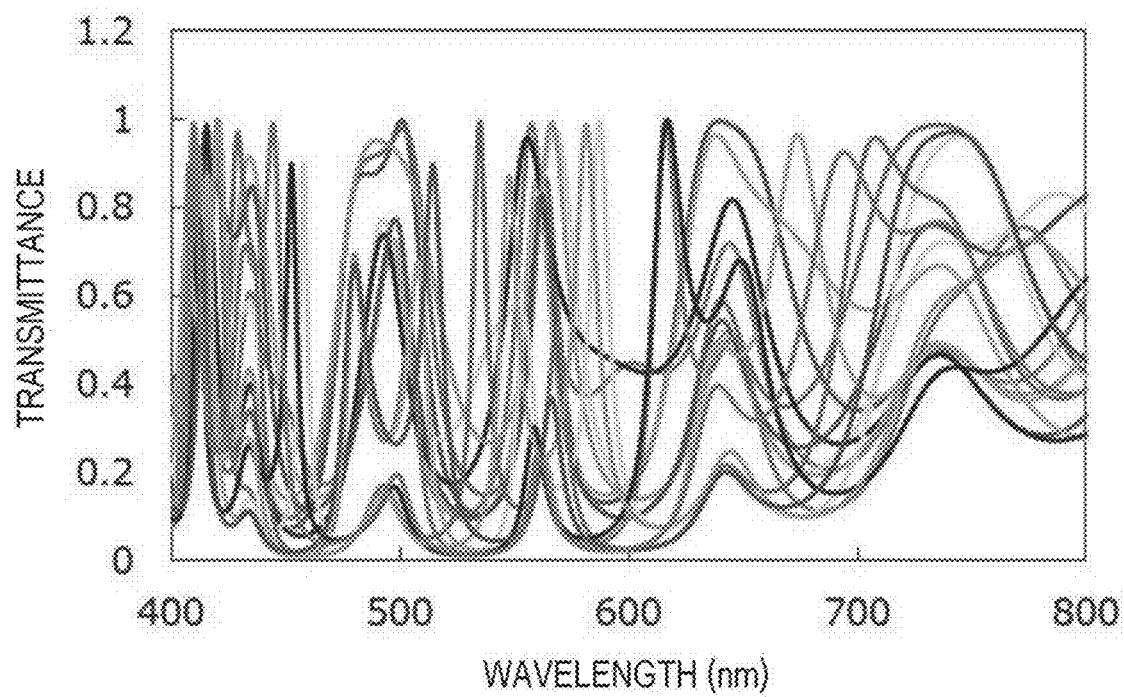
FIG. 19B is a diagram illustrating example transmission spectra of the filter array that includes band-limiting filters of one type.

FIG. 19B is a diagram illustrating example transmission spectra of the filter array 110 in which the band-limiting filters 114 of one type are disposed at some locations in addition to the eight types of multimode filters 113 described above. In this example, for each of the eight types of multimode filters 113, a location at which the band-limiting filter 114 is provided and a location at which the band-limiting filter 114 is not provided are present. Therefore, FIG. 19B illustrates 16 different transmission spectra in total (8×2=16). In this example, the first band-limiting filters 114a having the transmission spectrum illustrated in FIG. 18A were used. The first band-limiting filters 114a intensively impose a restriction on light in a wavelength range near 500 nm. As shown by FIG. 19B, when only the band-limiting filters 114 of one type are added, the transmission spectra are varied, and the randomness of the transmittance improves. Note that with a configuration in which the band-limiting filters 114 are provided, the peak wavelengths shift from those with a configuration in which the band-limiting filters 114 are not provided. This is because provision of the band-limiting filters 114 produces an effect similar to that attained by substantially increasing the thickness of the interference layer 26.

Figure 19C:
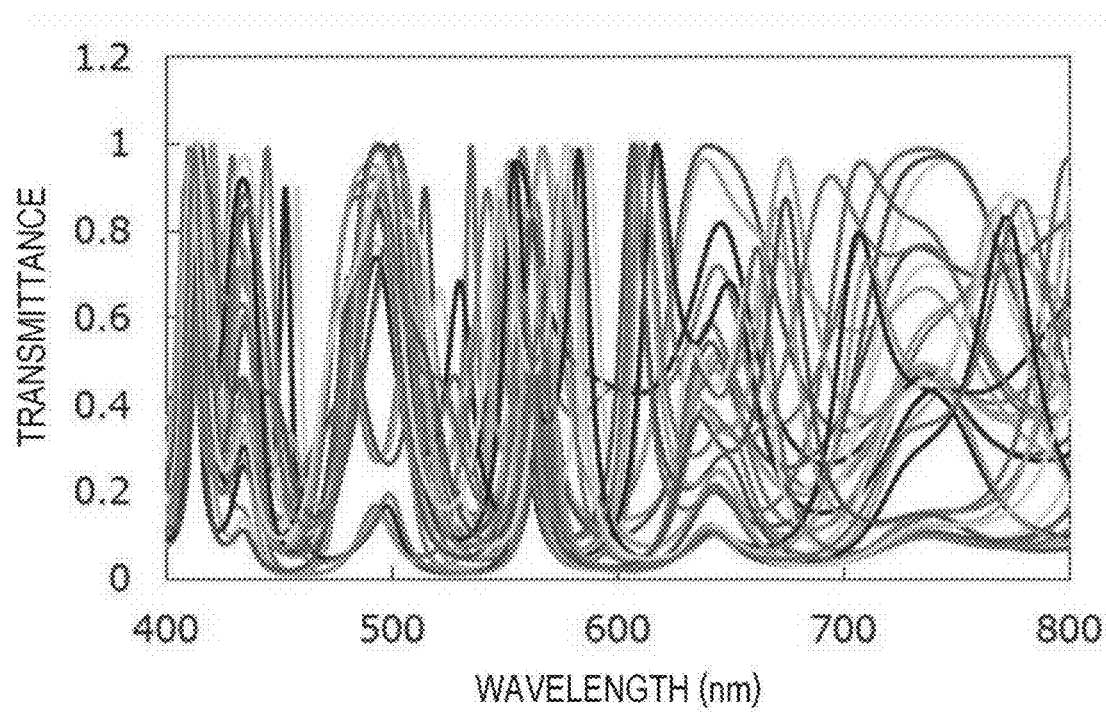
FIG. 19C is a diagram illustrating example transmission spectra of the filter array that includes band-limiting filters of three types.

FIG. 19C illustrates example transmission spectra of the filter array 110 in which the band-limiting filters 114 of three types are disposed in addition to the eight types of multimode filters 113 described above. In this example, for each of the eight types of multimode filters 113, a location at which the first band-limiting filter 114a is provided, a location at which the second band-limiting filter 114b is provided, a location at which the third band-limiting filter 114c is provided, and a location at which any of the band-limiting filters 114 is not provided are present. Therefore, FIG. 19C illustrates 32 different transmission spectra in total (8×4=32). The three types of band-limiting filters 114 used in this example respectively have the transmission spectra illustrated in FIG. 18A to FIG. 18C. The three types of band-limiting filters 114 intensively impose a restriction on light in a wavelength range near 500 nm, a wavelength range near 650 nm, and a wavelength range near 675 nm respectively. As shown by FIG. 19C, when the number of types of band-limiting filters 114 is increased to three types, the transmission spectra are further varied, and the randomness of the transmittance further improves.

Figure 19D:
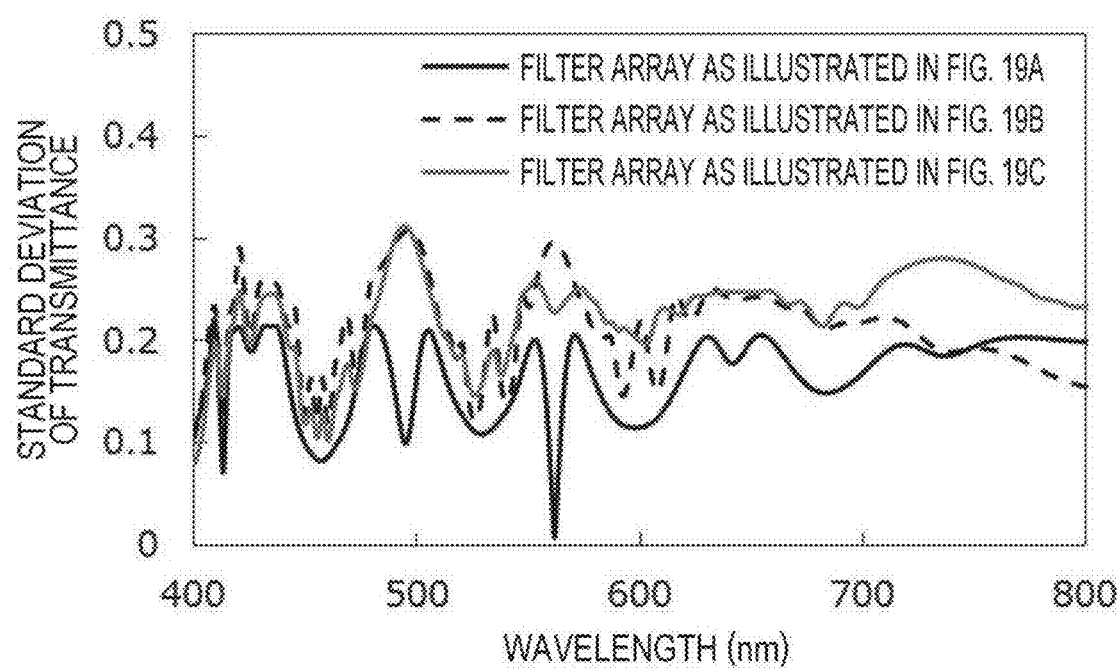
FIG. 19D is a graph illustrating the standard deviation of the transmittance of the filter array at each of the wavelengths.

FIG. 19D is a graph illustrating the standard deviation of the transmittance of the filter array 110 at each of the wavelengths in each of the cases illustrated in FIG. 19A to FIG. 19C. As the standard deviation of the transmittance increases, the randomness can be considered to be higher. When compared with the filter array, illustrated in FIG. 19A, not including the band-limiting filters 114, it is found that the randomness of the transmittance improves specifically at wavelengths near 500 nm with the filter array 110 illustrated in FIG. 19B. However, with the configuration illustrated in FIG. 19B in which the band-limiting filters 114 having a limiting band near 500 nm are added, the effect of improving the randomness of the transmittance is not so significant in some wavelength ranges (for example, near 530 nm, 590 nm, 610 nm, and 700 nm to 800 nm). In contrast, when the band-limiting filters 114 of plural types are added as in the example illustrated in FIG. 19C, high randomness can be maintained in a broader wavelength range. This shows that as the band-limiting filters 114 of a larger number of types are added, the effect of increasing the operating wavelength range is increased.

FIG. 20A is a diagram showing that a reconstruction error in hyperspectral images decreases by providing the band-limiting filters 114. FIG. 20A illustrates the result of calculating the mean squared error (MSE) in a reconstructed image generated for each of the 20 wavelength bands included in a wavelength range from 400 nm to 600 nm in each of the case where the band-limiting filters 114 are not disposed (the case illustrated in FIG. 19A) and the case where the band-limiting filters 114 are disposed (the case illustrated in FIG. 19C). As shown by FIG. 20A, when the band-limiting filters 114 are provided, the MSE significantly decreases in the shorter-wavelength range. That is, it is found that when the band-limiting filters 114 are provided, the randomness of the transmittance improves in the shorter-wavelength range, and an estimation error in a hyperspectral image is decreased.

FIG. 20B illustrates the result of calculating the MSE in a reconstructed image generated for each of the 20 wavelength bands included in a wavelength range from 1400 nm to 1600 nm in each of the case where the band-limiting filters 114 are not disposed (the case illustrated in FIG. 19A) and the case where the band-limiting filters 114 are disposed (the case illustrated in FIG. 19C). As shown by FIG. 20B, in the longer-wavelength range, even when the band-limiting filters 114 are provided, an estimation error in a hyperspectral image is kept small. Accordingly, it is found that when the band-limiting filters 114 are provided, a hyperspectral image having a small error can be acquired in a broad wavelength range from shorter wavelengths to longer wavelengths. That is, it is found that when the filter array 110 is formed by using filters in each of which the band-limiting filter 114 stacked on the multimode filter 113 is provided, the operating wavelength range of the hyperspectral imaging apparatus can be increased.

The structure of the filter array 110 described above is only an example and various modifications can be made to the structure of the filter array 110. Some modifications will be described below.

Figure 21:
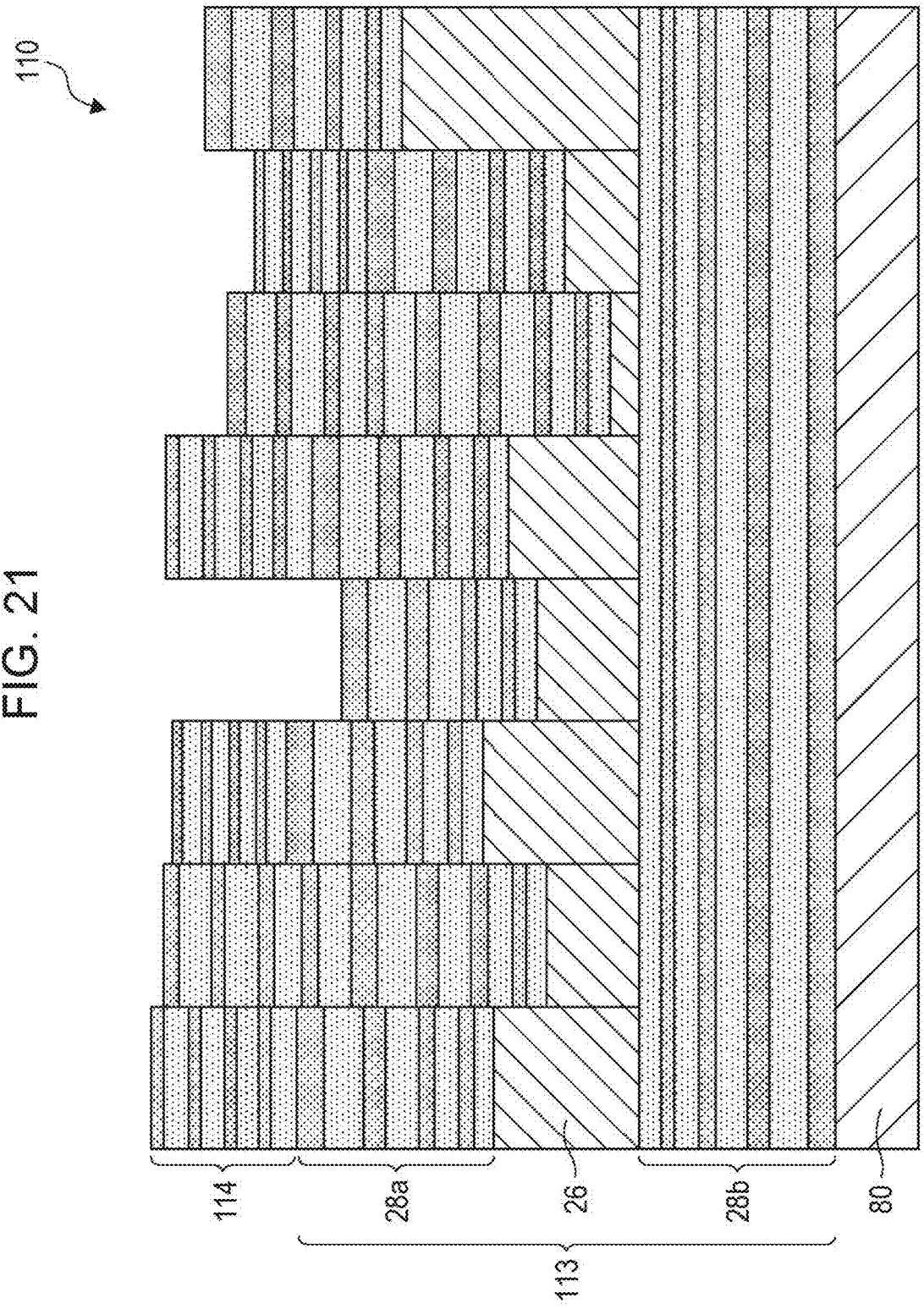
FIG. 21 is a schematic cross-sectional view of another example of the filter array.

FIG. 21 is a schematic cross-sectional view of a modification of the filter array 110. In the filter array 110 according to this example, the multimode filters 113 each include the interference layer 26, and the first reflective layer 28a and the second reflective layer 28b on both sides of the interference layer 26. Each of the first reflective layer 28a and the second reflective layer 28b is a DBR. That is, the multimode filter 113 according to this example has a structure in which the interference layer 26 is sandwiched between two DBRs. In this structure, on the DBR (that is, the first reflective layer 28a) in the upper part of the multimode filter 113, a DBR that constitutes the band-limiting filter 114 is stacked. Both of these DBRs have a structure in which low-refractive-index layers having a relatively low refractive index and high-refractive-index layers having a relatively high refractive index are alternately stacked. In the DBR of the first reflective layer 28a, the thicknesses of the low-refractive-index layers are not uniform, and the thicknesses of the high-refractive-index layers are not uniform either. In contrast, in the DBR of the band-limiting filter 114, the thicknesses of the low-refractive-index layers are uniform, and the thicknesses of the high-refractive-index layers are also uniform. Therefore, the DBR of the first reflective layer 28a and the DBR of the band-limiting filter 114 can be distinguished from each other on the basis of whether the thicknesses of the low-refractive-index layers are uniform and whether the thicknesses of the high-refractive-index layers are uniform. In each filter, the structure of the DBR of the first reflective layer 28a and the structure of the DBR of the second reflective layer 28b have a symmetrical relationship. Therefore, the DBR of the first reflective layer 28a in the upper part of the multimode filter 113 and the DBR of the band-limiting filter 114 can be distinguished from each other on the basis of whether the DBRs have a symmetrical structure with respect to the DBR of the second reflective layer 28b. In the example illustrated in FIG. 21, the number of types of band-limiting filters 114 is less than the number of types of the multimode filters 113, and the band-limiting filters 114 having the same structure are disposed above the respective pixels positioned within relatively narrow regions in the image sensor 160. In such a case, the first reflective layer 28a and the band-limiting filter 114 can also be distinguished from each other on the basis of the similarity to the structure of the DBR in a filter above another neighboring pixel.

Figure 22:
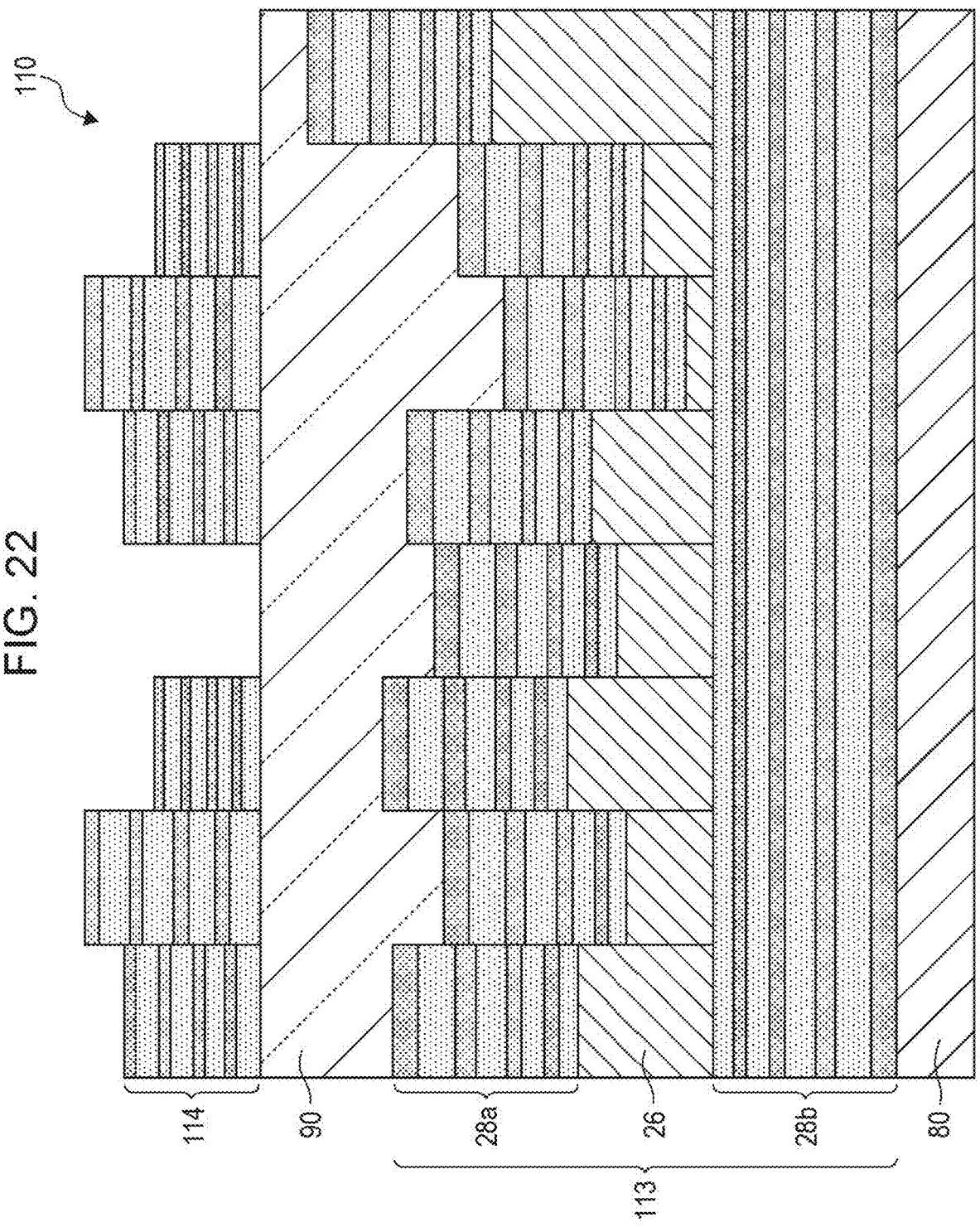
FIG. 22 is a schematic cross-sectional view of yet another example of the filter array.

FIG. 22 is a schematic cross-sectional view of an example structure of the filter array 110 that includes a spacer layer 90 between the multimode filters 113 and the band-limiting filters 114. The spacer layer 90 can be formed of a material having a transparent property in the target wavelength range W. When the spacer layer 90 is provided, indentations due to the differences in level of the surfaces of the multimode filters 113 can be filled to facilitate forming of the band-limiting filters 114. Although FIG. 22 illustrates a case where the spacer layer 90 that is relatively thin is provided, in actuality, the spacer layer 90 having a thickness with which no resonance occurs inside the spacer layer 90 can be used. Apart from the illustrated spacer layer 90, a spacer layer that fills indentations due to the differences in level of the surfaces of the band-limiting filters 114 may be separately provided. On this spacer layer, for example, a microlens array for efficiently making incident light rays converge onto pixels may be disposed.

Although the first reflective layer 28a and the second reflective layer 28b are disposed on both sides of the interference layer 26 in the filter array 110 illustrated in FIG. 22, a reflective layer may be disposed only on one side of the interference layer 26. Alternatively, filters in each of which reflective layers are disposed on both sides of the interference layer 26 and filters in each of which a reflective layer is disposed only on one side of the interference layer 26 may be mixed together. As described above, in each of the multimode filters 113, a reflective layer may be disposed only on one side of the interference layer 26 or reflective layers may be disposed on both sides of the interference layer 26.

In the examples described above, the positional relationship between the multimode filters 113 and the band-limiting filters 114 may be flipped. That is, the band-limiting filters 114 may be disposed at a position relatively closer to the image sensor, and the multimode filters 113 may be disposed at a position relatively farther from the image sensor.

The band-limiting filters 114 are not limited to DBRs and may be, for example, color filters. An example configuration in which the band-limiting filters 114 are color filters will be described below.

Figure 23:
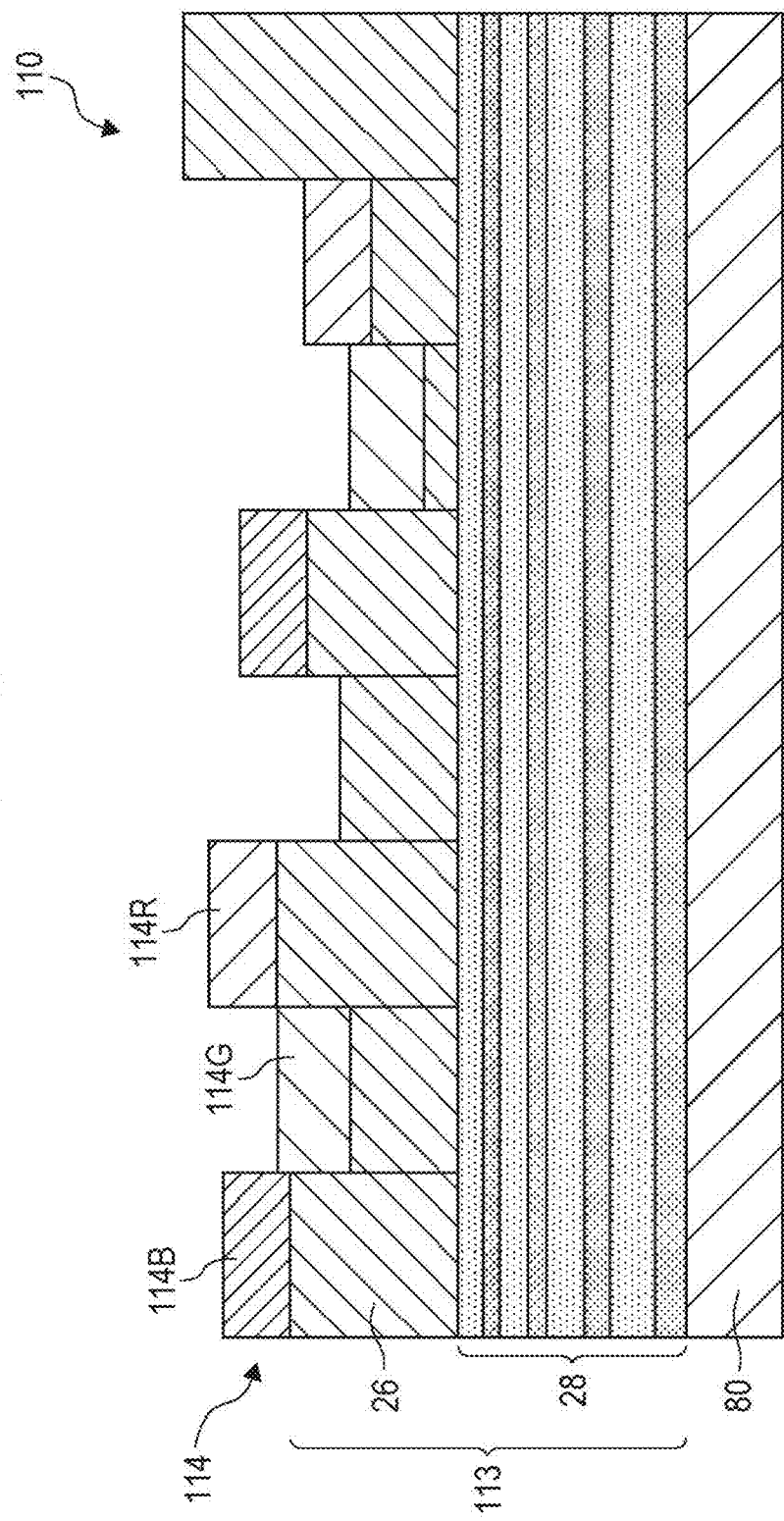
FIG. 23 is a schematic cross-sectional view of yet another example of the filter array.

FIG. 23 is a schematic cross-sectional view of an example structure of the filter array 110 that includes color filters as the band-limiting filters 114. A color filter has a characteristic of transmitting or absorbing only light in a specific wavelength range, and therefore, can be used as the band-limiting filter 114. In the example illustrated in FIG. 23, three types of color filters 114R, 114G, and 114B that selectively transmit light in a wavelength range of red light, light in a wavelength range of green light, and light in a wavelength range of blue light respectively are disposed. The filter array 110 includes filters that do not include a color filter. For example, color filters, other than the red, green, and blue color filters, that selectively transmit light in other colors, such as cyan, magenta, and yellow, may be used. As in the example illustrated in FIG. 23, color filters need not cover all the multimode filters 113. That is, some of the multimode filters 113 need not be covered by color filters.

Although one side of the interference layer 26 is in contact with the reflective layer 28 that is a DBR in the example illustrated in FIG. 23, both sides of the interference layer 26 may be in contact with DBRs. In the structure illustrated in FIG. 23, the positional relationship between the interference layer 26 and the reflective layer 28 may be flipped. That is, on the substrate 80, the interference layers 26, the reflective layers 28, and the band-limiting filters 114 (that is, color filters) may be stacked in this order. In the configuration illustrated in FIG. 23, the positional relationship between the multimode filter 113 and the band-limiting filter 114 may be flipped. That is, on the substrate 80, the band-limiting filters 114 and the multimode filters 113 may be stacked in this order.

Figure 24:
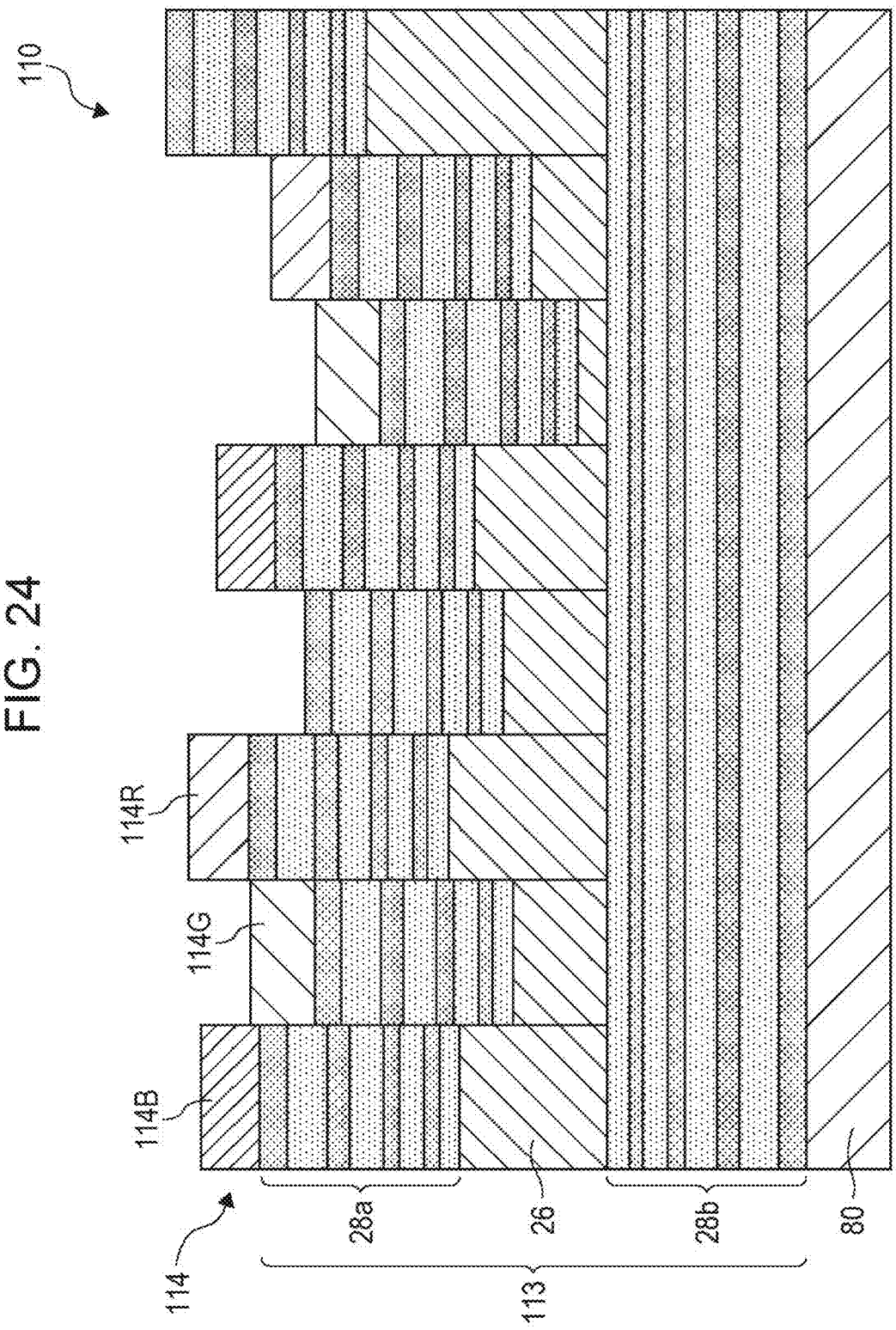
FIG. 24 is a schematic cross-sectional view of yet another example of the filter array.

FIG. 24 is a diagram illustrating an example structure that is based on the configuration illustrated in FIG. 23 and in which DBRs, that is, the first reflective layer 28a and the second reflective layer 28b, are disposed on both sides of the interference layer 26. In this structure, the positional relationship between the multimode filter 113 and the band-limiting filter 114 may also be flipped.

Figure 25:
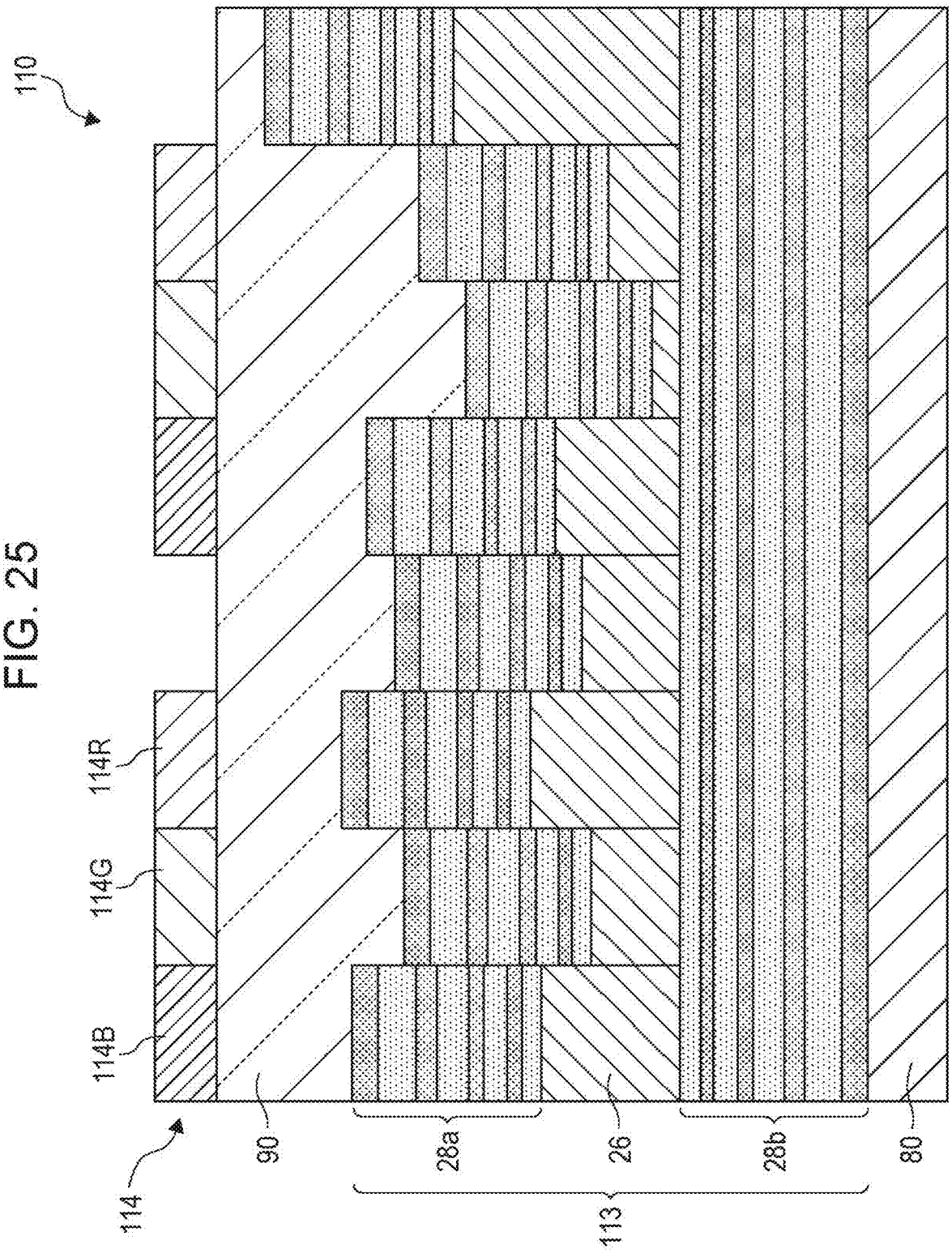
FIG. 25 is a schematic cross-sectional view of yet another example of the filter array.

FIG. 25 is a diagram illustrating an example structure that is based on the structure illustrated in FIG. 24 and in which the spacer layer 90 is added between the multimode filters 113 and the band-limiting filters 114, that is, color filters. The spacer layer 90 can be formed of a material that is substantially transparent in the target wavelength range W. The multimode filter 113 includes the first reflective layer 28a and the second reflective layer 28b on both sides of the interference layer 26. One of the first reflective layer 28a or the second reflective layer 28b may be removed from the structure illustrated in FIG. 25.

Now, example characteristics of the band-limiting filter 114 will be described.

Figure 26A:
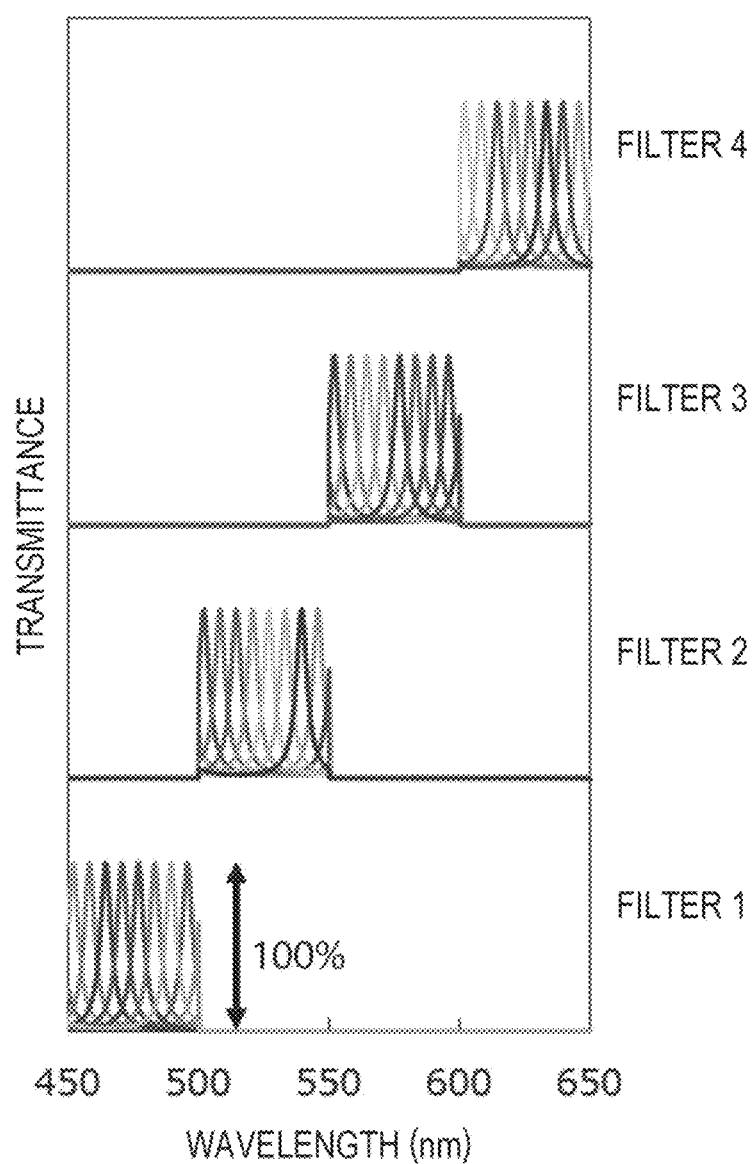
FIG. 26A is a diagram illustrating example transmission spectra of the filter array that includes band-limiting filters each having a rectangular transmission spectrum in which the transmittance in the limiting band is 0%.
Figure 26B:
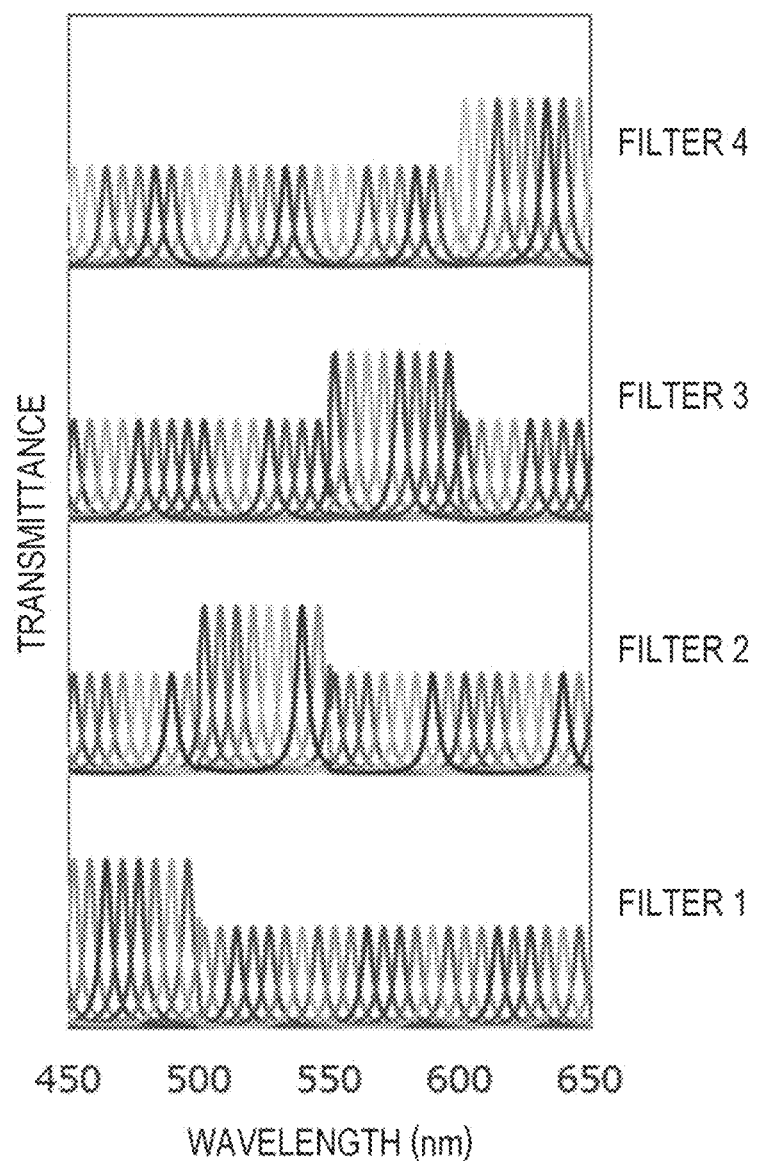
FIG. 26B is a diagram illustrating example transmission spectra of the filter array that includes band-limiting filters each having a rectangular transmission spectrum in which the transmittance in the limiting band is 60%.
Figure 26C:
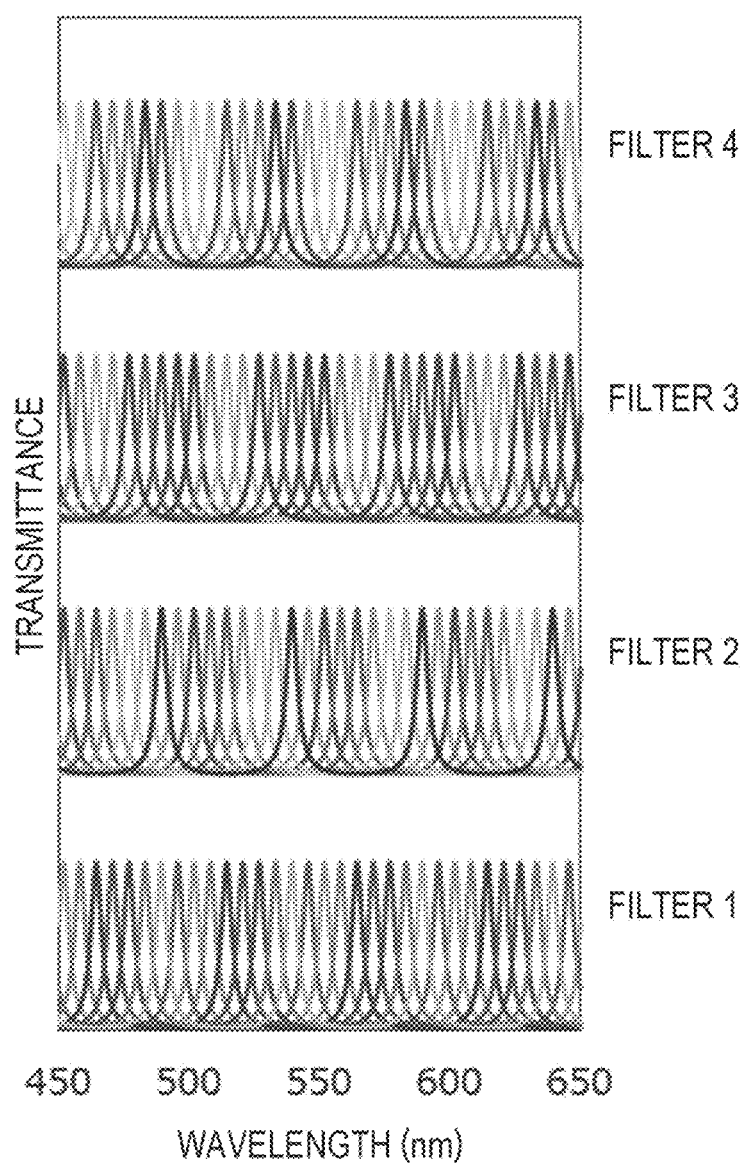
FIG. 26C is a diagram illustrating example transmission spectra of the filter array that does not include band-limiting filters.

The present inventors carried out a simulation concerning the filter array 110 that includes plural types of band-limiting filters 114 having different limiting bands to confirm changes in errors in reconstructed hyperspectral images occurring in response to changing of the optical transmittance of each band-limiting filter 114 in the limiting band. FIG. 26A to FIG. 26C illustrate example transmission spectra of the filter array 110 used in the simulation. FIG. 26A to FIG. 26C illustrate example transmission spectra acquired when each of the four types of band-limiting filters 114 having different limiting bands is disposed on eight types of multimode filters 113. It is assumed here that each of the multimode filters 113 has an ideal transmission spectrum expressed by the Lorentz function. The transmittance of each of the band-limiting filters 114 in the pass-band was set to 100%, and reconstruction errors were evaluated on different conditions in which the transmittance in the limiting band was changed.

FIG. 26A illustrates example transmission spectra of the filter array 110 that includes the band-limiting filters 114 each having a rectangular transmission spectrum in which the transmittance in the limiting band is 0%. FIG. 26B illustrates example transmission spectra of the filter array 110 that includes the band-limiting filters 114 each having a rectangular transmission spectrum in which the transmittance in the limiting band is 60%. FIG. 26C illustrates example transmission spectra of the filter array 110 that does not include the band-limiting filters 114, which means that the transmittance in the limiting band is 100%. In FIG. 26A to 26C, the transmission spectrum of filter 1 in which the band-limiting filter 114 having a pass-band of 450 nm to 500 nm is superimposed, the transmission spectrum of filter 2 in which the band-limiting filter 114 having a pass-band of 500 nm to 550 nm is superimposed, the transmission spectrum of filter 3 in which the band-limiting filter 114 having a pass-band of 550 nm to 600 nm is superimposed, and the transmission spectrum of filter 4 in which the band-limiting filter 114 having a pass-band of 600 nm to 650 nm is superimposed are illustrated in this order from the bottom.

As illustrated in FIG. 26A and FIG. 26B, the filter 112 that includes the multimode filter 113 and the band-limiting filter 114 can have, within the target wavelength range W, peak wavelengths at each of which a local maximum appears. That is, transmitted light that has passed through the multimode filter 113 and the band-limiting filter 114 has at least two peak wavelengths, and each of the photodetection elements 162 included in the image sensor 160 can detect the transmitted light having at least two peak wavelengths.

Figure 27:
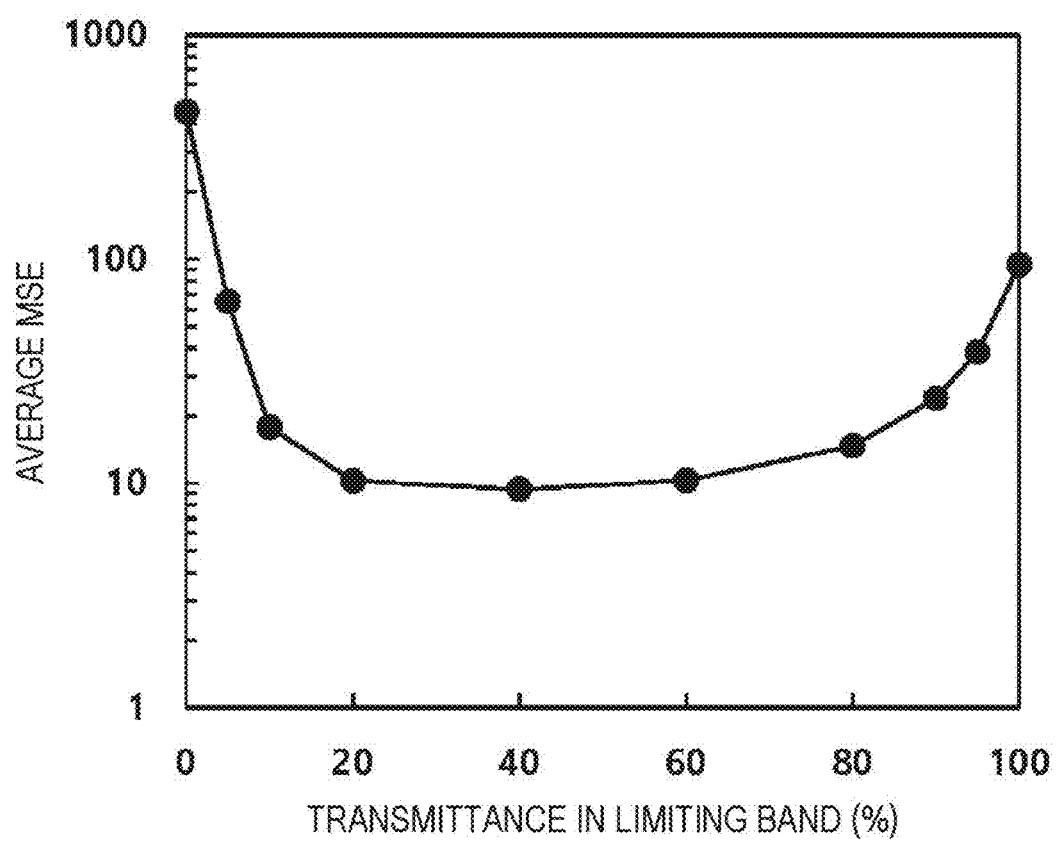
FIG. 27 is a graph illustrating an example relationship between the average of the mean squared errors (MSE) between estimated images and ground truth images for respective bands and the transmittance in a limiting band.

The filter array 110 in which the four types of band-limiting filters 114 described above were mixed together was used to evaluate a reconstruction error when a hyperspectral image was estimated for each of the 20 wavelength bands included in a wavelength range from 450 nm to 650 nm. FIG. 27 is a graph illustrating a relationship between the average of the mean squared errors (MSE) between the estimated images and ground truth images for the 20 respective wavelength bands and the transmittance in the limiting band. As illustrated in FIG. 27, when the transmittance in the limiting band is 100%, the estimation error is large. This is because the transmittance in the limiting band being 100% means that the band-limiting filters 114 are not present. When the transmittance in the limiting band is 0%, the estimation error is also large because luminance information in the limiting band is missing. From the result illustrated in FIG. 27, it is desirable that the transmittance in the limiting band of the band-limiting filter 114 be 10% to 80% of the transmittance in the pass-band. Although it is assumed in this example that the transmittance of each of the band-limiting filters 114 in the limiting band is constant regardless of the wavelength for the sake of simplification, the transmittance can generally change within the limiting band depending on the wavelength. Even in this case, when the average transmittance in the limiting band is within a range of 10% to 80% of the maximum transmittance in the target wavelength range W, a reconstruction error can be reduced. Here, the average transmittance in the limiting band can be calculated by averaging the transmittances in wavelength bands included in the limiting band. From the result described above, when the average of the transmittances in the respective wavelength bands in the limiting band of each band-limiting filter 114 is set to a value greater than or equal to 10% and less than or equal to 80% of the maximum transmittance of the band-limiting filter in the target wavelength range W, an estimation error in a hyperspectral image can be significantly reduced. When the average of the transmittances in the respective wavelength bands in the limiting band of each band-limiting filter 114 is set to a value greater than or equal to 15% and less than or equal to 70% of the maximum transmittance of the band-limiting filter in the target wavelength range W, an estimation error in a hyperspectral image can be further reduced.

Here, a case as illustrated in FIG. 26A or FIG. 27 where the band-limiting filters 114 have a limiting band in which the transmittance is 0% will be considered. In this case, light that has passed through both the multimode filter 113 and the band-limiting filter 114 may have only one peak in the target wavelength range. In this case, a signal output from the image sensor corresponds to a signal that is output when a single-mode filter is used. This state can be avoided when one of the condition that the multimode filter 113 has plural peaks in a band other than the limiting band in the target wavelength range or the condition that the transmittance of the band-limiting filter 114 in the limiting band is not equal to 0% but has a significant value (for example, a transmittance value greater than or equal to 10%) is satisfied. That is, each of the photodetection elements 162 included in the image sensor 160 can output a signal corresponding to light having plural peak wavelengths.

As described above, a filter array according to an exemplary embodiment of the present disclosure includes optical filters that are arranged in two dimensions. The optical filters include a first filter and a second filter. The first filter includes a first multimode filter that has, within a target wavelength range, first peak wavelengths at each of which the optical transmittance is at a local maximum, and a first band-limiting filter that restricts transmission of light in a first sub-wavelength range that is a part of the target wavelength range. The second filter includes a second multimode filter that has, within the target wavelength range, second peak wavelengths at each of which the optical transmittance is at a local maximum, at least one of the second peak wavelengths being different from a combination of the first peak wavelengths, and a second band-limiting filter that restricts transmission of light in a second sub-wavelength range that is a part of the target wavelength range and that is different from the first sub-wavelength range.

The filter array can be used in, for example, an imaging system that generates pieces of image data (that is, pieces of hyperspectral data) relating to respective wavelength bands included in the target wavelength range. With the above-described configuration, the randomness of the wavelength distribution and spatial distribution of the transmittances of the optical filters included in the filter array is easily improved. Accordingly, the accuracy of the pieces of hyperspectral data generated by hyperspectral imaging using the filter array and by a reconstruction operation is easily improved.

At least a part of the first multimode filter and the first band-limiting filter may be disposed on a first optical axis, and at least a part of the second multimode filter and the second band-limiting filter may be disposed on a second optical axis.

At least a part of the first multimode filter may overlap the first band-limiting filter in plan view, and at least a part of the second multimode filter may overlap the second band-limiting filter in plan view.

Each of the first multimode filter and the second multimode filter can be, for example, an interference filter. When an interference filter is used, a multimode filter that has peak wavelengths within the target wavelength range is easily implemented.

In an example, each of the first multimode filter and the second multimode filter may include an interference layer, and a first reflective layer that is in contact with the interference layer and that is a dielectric multilayer film.

In an example, each of the first multimode filter and the second multimode filter may further include a second reflective layer that is in contact with the interference layer and that is a dielectric multilayer film. In each of the first multimode filter and the second multimode filter, the interference layer may be positioned between the first reflective layer and the second reflective layer.

With such a structure, a multimode filter having peak wavelengths within the target wavelength range is implemented more easily.

Each of the first band-limiting filter and the second band-limiting filter can be, for example, a color filter. Alternatively, each of the first band-limiting filter and the second band-limiting filter may be a filter that includes a dielectric multilayer film.

An average optical transmittance of the first band-limiting filter in the first sub-wavelength range can be greater than or equal to 10% and less than or equal to 80% of a maximum optical transmittance of the first band-limiting filter in the target wavelength range. Similarly, an average optical transmittance of the second band-limiting filter in the second sub-wavelength range can be greater than or equal to 10% and less than or equal to 80% of a maximum optical transmittance of the second band-limiting filter in the target wavelength range. Here, "average optical transmittance" in a wavelength range can be calculated by, for example, averaging transmittances of light measured for respective wavelength bands included in the wavelength range. When band-limiting filters that satisfy the above-described conditions are provided, an error in generated hyperspectral data can be reduced.

The average optical transmittance of the first band-limiting filter in the first sub-wavelength range can be greater than or equal to 15% and less than or equal to 70% of the maximum optical transmittance of the first band-limiting filter in the target wavelength range. Similarly, the average optical transmittance of the second band-limiting filter in the second sub-wavelength range can be greater than or equal to 15% and less than or equal to 70% of the maximum optical transmittance of the second band-limiting filter in the target wavelength range. When band-limiting filters that satisfy the above-described conditions are provided, an error in generated hyperspectral data can be further reduced.

The optical filters can further include a third filter. The third filter can include a third multimode filter that has, within the target wavelength range, third peak wavelengths at each of which the optical transmittance is at a local maximum, at least one of the third peak wavelengths being different from the first peak wavelengths, at least one of the third peak wavelengths being different from the second peak wavelengths, and a third band-limiting filter that restricts transmission of light in a third sub-wavelength range that is a part of the target wavelength range and that is different from both the first sub-wavelength range and the second sub-wavelength range. When the above-described third filter is provided, the wavelength distribution and spatial distribution of the transmittance of the filter array can be further varied, and a reconstruction error is further reduced easily.

The optical filters may further include a fourth filter. The fourth filter can include a fourth multimode filter that has, within the target wavelength range, fourth peak wavelengths at each of which the optical transmittance is at a local maximum, at least one of the fourth peak wavelengths being different from the first peak wavelengths, at least one of the fourth peak wavelengths being different from the second peak wavelengths. The fourth filter may or might not include a band-limiting filter. When the above-described fourth filter is provided, the wavelength distribution and spatial distribution of the transmittance of the filter array can be further varied, and a reconstruction error is further reduced easily.

The optical filters may include four or more types of filters having transmittances whose wavelength dependence differs. Among the four or more types of filters, at least one type of filter can include a band-limiting filter in addition to a multimode filter. When a larger number of types of filters including multimode filters having different transmission spectra and band-limiting filters having different limiting bands are mixed together, the variety of the transmission spectrum of the filter array improves, and a reconstruction error can be reduced.

First transmitted light that has passed through the first multimode filter and the first band-limiting filter may have at least two peak wavelengths in the target wavelength range, and second transmitted light that has passed through the second multimode filter and the second band-limiting filter may have at least two peak wavelengths in the target wavelength range.

At least two wavelengths of the first peak wavelengths may be included in a wavelength range different from the first sub-wavelength range, and at least two wavelengths of the second peak wavelengths may be included in a wavelength range different from the second sub-wavelength range.

An imaging system according to an exemplary embodiment of the present disclosure can include: an image sensor that receives light having passed through the filter array described above and outputs an image signal based on the light; and a signal processing apparatus that generates, on the basis of the image signal, pieces of image data each relating to a corresponding one of wavelength bands included in the target wavelength range. With such an imaging system, satisfactory hyperspectral data can be generated.

The technique of the present disclosure is useful to, for example, cameras and measuring devices that acquire multi-wavelength images. The technique of the present disclosure is applicable to, for example, biological, medical, and cosmetic sensing, systems for inspecting food for foreign matter and agrochemical residues, remote sensing systems, and vehicle-mounted sensing systems.

What is claimed is:
1. A filter array comprising:
optical filters that are arranged in two dimensions, wherein
the optical filters include a first filter and a second filter, the first filter includes
    a first multimode filter that has, within a target wavelength range, first peak wavelengths at each of which an optical transmittance is at a local maximum, and
    a first band-limiting filter that restricts transmission of light in a first sub-wavelength range that is a part of the target wavelength range, and
the second filter includes
    a second multimode filter that has, within the target wavelength range, second peak wavelengths at each of which an optical transmittance is at a local maximum, at least one of the second peak wavelengths being different from the first peak wavelengths, and
    a second band-limiting filter that restricts transmission of light in a second sub-wavelength range that is a part of the target wavelength range and that is different from the first sub-wavelength range,
first transmitted light that has passed through the first multimode filter and the first band-limiting filter has at least two peak wavelengths in the target wavelength range, and
second transmitted light that has passed through the second multimode filter and the second band-limiting filter has at least two peak wavelengths in the target wavelength range.

2. The filter array according to claim 1, wherein
at least a part of the first multimode filter and the first band-limiting filter are disposed on a first optical axis, and
at least a part of the second multimode filter and the second band-limiting filter are disposed on a second optical axis.

3. The filter array according to claim 1, wherein
at least a part of the first multimode filter overlaps the first band-limiting filter in plan view, and
at least a part of the second multimode filter overlaps the second band-limiting filter in plan view.

4. The filter array according to claim 1, wherein
each of the first multimode filter and the second multimode filter is an interference filter.

5. The filter array according to claim 1, wherein
each of the first multimode filter and the second multimode filter includes
an interference layer, and
a first reflective layer that is in contact with the interference layer and that is a dielectric multilayer film.

6. The filter array according to claim 5, wherein
each of the first multimode filter and the second multimode filter further includes a second reflective layer that is in contact with the interference layer and that is a dielectric multilayer film, and
in each of the first multimode filter and the second multimode filter, the interference layer is positioned between the first reflective layer and the second reflective layer.

7. The filter array according to claim 5 wherein
the first reflective layer is shared between the first multimode filter and the second multimode filter.

8. The filter array according to claim 1, wherein
each of the first band-limiting filter and the second band-limiting filter is a color filter.

9. The filter array according to claim 1, wherein
each of the first band-limiting filter and the second band-limiting filter includes a dielectric multilayer film.

10. The filter array according to claim 1, wherein
an average optical transmittance of the first band-limiting filter in the first sub-wavelength range is greater than or equal to 10% and less than or equal to 80% of a maximum optical transmittance of the first band-limiting filter in the target wavelength range, and
an average optical transmittance of the second band-limiting filter in the second sub-wavelength range is greater than or equal to 10% and less than or equal to 80% of a maximum optical transmittance of the second band-limiting filter in the target wavelength range.

11. The filter array according to claim 10, wherein
the average optical transmittance of the first band-limiting filter in the first sub-wavelength range is greater than or equal to 15% and less than or equal to 70% of the maximum optical transmittance of the first band-limiting filter in the target wavelength range, and
the average optical transmittance of the second band-limiting filter in the second sub-wavelength range is greater than or equal to 15% and less than or equal to 70% of the maximum optical transmittance of the second band-limiting filter in the target wavelength range.

12. The filter array according to claim 1, wherein
the optical filters further include a third filter, and
the third filter includes
a third multimode filter that has, within the target wavelength range, third peak wavelengths at each of which an optical transmittance is at a local maximum, at least one of the third peak wavelengths being different from the first peak wavelengths, at least one of the third peak wavelengths being different from the second peak wavelengths, and
a third band-limiting filter that restricts transmission of light in a third sub-wavelength range that is a part of the target wavelength range and that is different from both the first sub-wavelength range and the second sub-wavelength range.

13. The filter array according to claim 1, wherein
the optical filters further include a fourth filter, and
the fourth filter includes a fourth multimode filter that has, within the target wavelength range, fourth peak wavelengths at each of which an optical transmittance is at a local maximum, at least one of the fourth peak wavelengths being different from the first peak wavelengths, at least one of the fourth peak wavelengths being different from the second peak wavelengths.

14. The filter array according to claim 1, wherein
at least two wavelengths of the first peak wavelengths are included in a wavelength range different from the first sub-wavelength range, and
at least two wavelengths of the second peak wavelengths are included in a wavelength range different from the second sub-wavelength range.

15. The filter array according to claim 1 wherein
the first multimode filter has the first peak wavelengths in a wavelength range other than the first subwavelength range in the target wavelength range, and
the second multimode filter has the second peak wavelengths in a wavelength range other than the second subwavelength range in the target wavelength range.

16. The filter array according to claim 1 wherein
the first band-limiting filter has a transmittance value in the first subwavelength range greater than or equal to 10%, and
the second band-limiting filter has a transmittance value in the second subwavelength range greater than or equal to 10%.

17. An imaging system comprising:
the filter array according to claim 1;
an image sensor that receives light having passed through the filter array and outputs an image signal based on the light;
a memory; and
a processor that executes instructions stored on the memory so as to generate, on the basis of the image signal, pieces of image data each relating to a corresponding one of wavelength bands included in the target wavelength range.

* * * * *